US012240153B2

(12) United States Patent
Kawaguchi et al.

(10) Patent No.: US 12,240,153 B2
(45) Date of Patent: *Mar. 4, 2025

(54) RESIN SUPPLY APPARATUS, RESIN SEALING APPARATUS, AND METHOD FOR MANUFACTURING RESIN-SEALED PRODUCT

(71) Applicant: APIC YAMADA CORPORATION, Nagano (JP)

(72) Inventors: Makoto Kawaguchi, Nagano (JP); Masahiko Fujisawa, Nagano (JP); Yoshikazu Muramatsu, Nagano (JP); Minoru Hanazato, Nagano (JP)

(73) Assignee: APIC YAMADA CORPORATION, Nagano (JP)

( * ) Notice: Subject to any disclaimer, the term of this patent is extended or adjusted under 35 U.S.C. 154(b) by 65 days.

This patent is subject to a terminal disclaimer.

(21) Appl. No.: 17/492,663

(22) Filed: Oct. 3, 2021

(65) Prior Publication Data

US 2022/0152888 A1 May 19, 2022

(30) Foreign Application Priority Data

Nov. 17, 2020 (JP) .................................. 2020-191055

(51) Int. Cl.
*B29C 43/34* (2006.01)
*B29C 43/02* (2006.01)
(Continued)

(52) U.S. Cl.
CPC ............ *B29C 43/34* (2013.01); *B29C 43/027* (2013.01); *B29C 43/18* (2013.01);
(Continued)

(58) Field of Classification Search
CPC ...... B29C 2043/182; B29C 2043/3433; B29C 2043/3438; B29C 2043/3488;
(Continued)

(56) References Cited

U.S. PATENT DOCUMENTS

2005/0202350 A1* 9/2005 Colburn ............ H01L 21/76817
430/323

FOREIGN PATENT DOCUMENTS

| JP | 2018134846 | | 8/2018 | |
| JP | 2018134846 | A * | 8/2018 | ............ B29C 39/10 |
| KR | 20100019137 | A * | 2/2010 | |

OTHER PUBLICATIONS

"Office Action of China Counterpart Application", issued on Mar. 23, 2024, with English translation thereof, pp. 1-13.

* cited by examiner

*Primary Examiner* — John J DeRusso
*Assistant Examiner* — Victoria Bartlett
(74) *Attorney, Agent, or Firm* — JCIPRNET

(57) ABSTRACT

A resin supply apparatus includes a calculation unit for calculating a resin supply pattern based on the shape of a cavity of a resin sealing mold, and a supply unit for supplying a resin to an object to be coated along the resin supply pattern. The resin supply pattern has a plurality of linear paths, and one of mutually adjacent linear paths is inclined with respect to an axis of symmetry that divides a cavity in line symmetry, the other one of the mutually adjacent linear paths is inclined with respect to the one linear path, and a region between the mutually adjacent linear paths is opened to the outside of the object to be coated, at least on a side on which the other linear path is separated from the one linear path.

15 Claims, 15 Drawing Sheets

(51) Int. Cl.
*B29C 43/18* (2006.01)
*B29L 31/34* (2006.01)

(52) U.S. Cl.
CPC ............... *B29C 2043/3433* (2013.01); *B29C 2043/3488* (2013.01); *B29L 2031/34* (2013.01)

(58) Field of Classification Search
CPC ......... B29C 33/10; B29C 33/58; B29C 33/68; B29C 43/027; B29C 43/18; B29C 43/34; B29L 2031/34; H01L 21/565; H01L 21/6715; H01L 2924/181; H01L 21/67126; H01L 21/561
See application file for complete search history.

RESIN SUPPLY APPARATUS, RESIN SEALING APPARATUS, AND METHOD FOR MANUFACTURING RESIN-SEALED PRODUCT

CROSS-REFERENCE TO RELATED APPLICATIONS

This application claims the priority benefit of Japanese Patent Application No. 2020-191055, filed on Nov. 17, 2020. The entirety of the above-mentioned patent application is hereby incorporated by reference herein and made a part of this specification.

BACKGROUND

Technical Field

The present invention relates to a resin supply apparatus, a resin sealing apparatus, and a method for manufacturing a resin-sealed product.

Related Art

It is known that a workpiece is resin-sealed by compression molding. A resin sealing apparatus using the compression molding generally includes a resin supply apparatus for supplying a resin onto a workpiece or a release film, and a resin sealing mold that spreads the resin on the workpiece and heats and pressurizes the resin.

Here, Patent literature 1 discloses that a resin supply pattern supplied by a resin supply apparatus is formed in a spiral shape or a lattice shape in a vacuum chamber.

LITERATURE OF RELATED ART

Patent Literature

Patent literature 1: Japanese Patent Laid-Open No. 2018-134846

However, even when the resin is supplied in the vacuum chamber as in the resin supply apparatus described in Patent literature 1, if air or gas generated from the resin is present in a mold for molding, the air or gas may be caught in the resin, which may cause defects such as air traps or voids caused by poor filling.

SUMMARY

The present invention provides a resin supply apparatus, a resin sealing apparatus, and a method for manufacturing a resin-sealed product, which can suppress occurrence of defects.

A resin supply apparatus according to one aspect of the present invention is a resin supply apparatus for supplying a resin onto an object to be coated which is arranged in a lower mold of a resin sealing mold. The resin supply apparatus includes: a calculation unit for calculating a resin supply pattern based on the shape of a cavity of the resin sealing mold; and a supply unit for supplying a resin to the object to be coated along the resin supply pattern. The resin supply pattern has a plurality of linear paths. One of mutually adjacent linear paths in the plurality of linear paths is inclined with respect to an axis of symmetry that divides the cavity in line symmetry, and the other one of the mutually adjacent linear paths in the plurality of linear paths is inclined with respect to the one linear path. A region between the mutually adjacent linear paths in the plurality of linear paths is opened to the outside of the object to be coated, at least on a side on which the other linear path is separated from the one linear path.

A resin sealing apparatus according to one aspect of the present invention includes the resin supply apparatus according to any one of the above aspects, and a resin sealing mold for sealing elements on a workpiece with a resin. The resin sealing mold has a cavity in which a resin is filled and a plurality of air vents for discharging air from the cavity. The object to be coated is arranged in the resin sealing mold so that at least one of the plurality of air vents is located on an extension line of a region between mutually adjacent linear paths in the plurality of linear paths.

A method for manufacturing a resin-sealed product according to one aspect of the present invention includes supplying a resin onto an object to be coated which is arranged in a lower mold of a resin sealing mold. The method for manufacturing a resin-sealed product includes: calculating a resin supply pattern based on the shape of a cavity of the resin sealing mold; and supplying a resin to the object to be coated along the resin supply pattern. The resin supply pattern has a plurality of linear paths. One of the mutually adjacent linear paths in the plurality of linear paths is inclined with respect to an axis of symmetry that divides the cavity in line symmetry, and the other one of the mutually adjacent linear paths in the plurality of linear paths is inclined with respect to the one linear path. A region between the mutually adjacent linear paths in the plurality of linear paths is opened to the outside of the object to be coated, at least on a side on which the other linear path is separated from the one linear path

DESCRIPTION OF THE EMBODIMENTS

Hereinafter, embodiments of the present invention are described with reference to the drawings. The drawings of each embodiment are for purposes of illustration, the dimensions and shape of each part are schematically shown, and the technical scope of the present invention should not be interpreted as being limited to the embodiments.

First Embodiment

Figure 1:
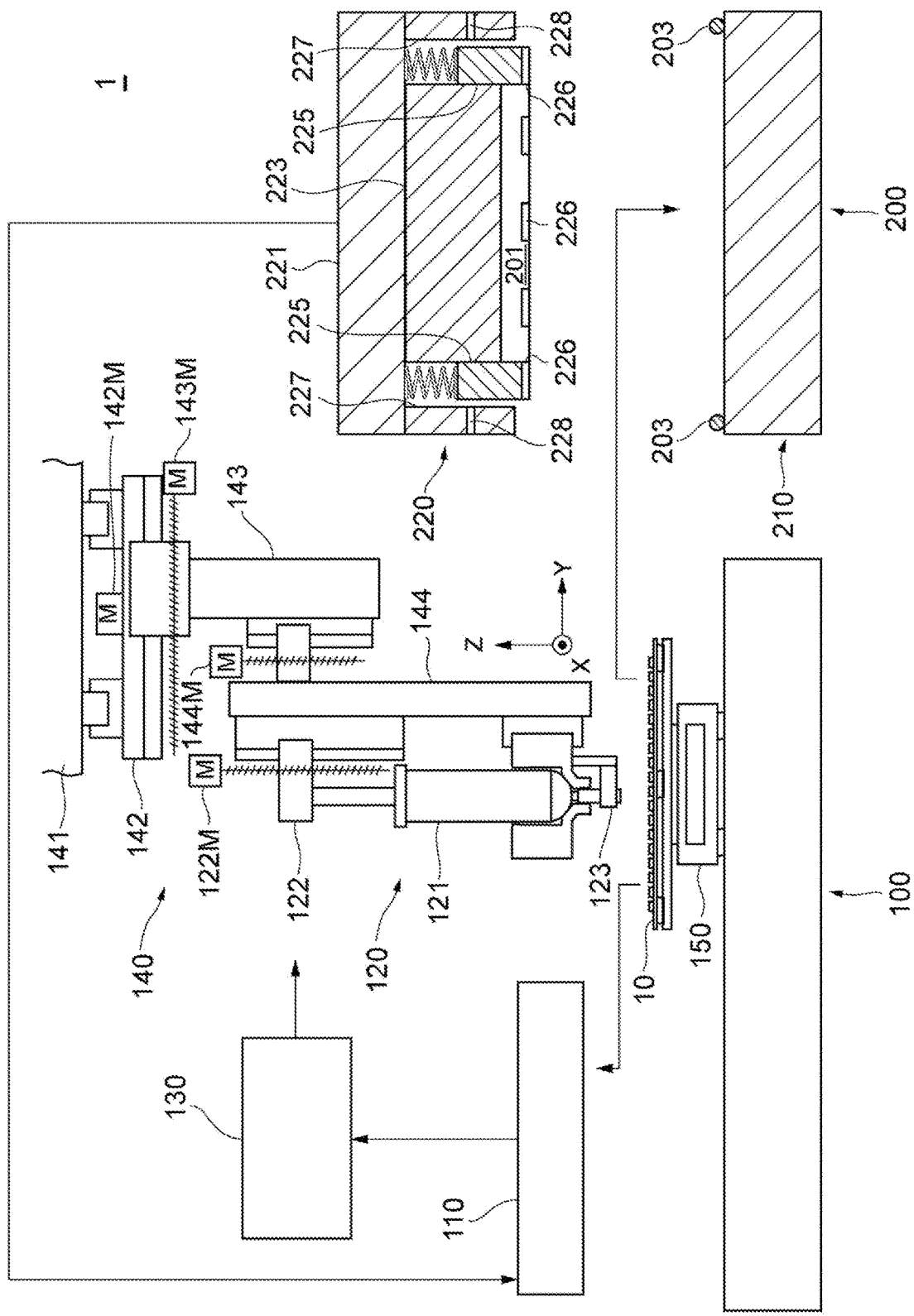
FIG. 1 is a diagram schematically showing a configuration of a resin sealing apparatus according to a first embodiment.
Figure 2:
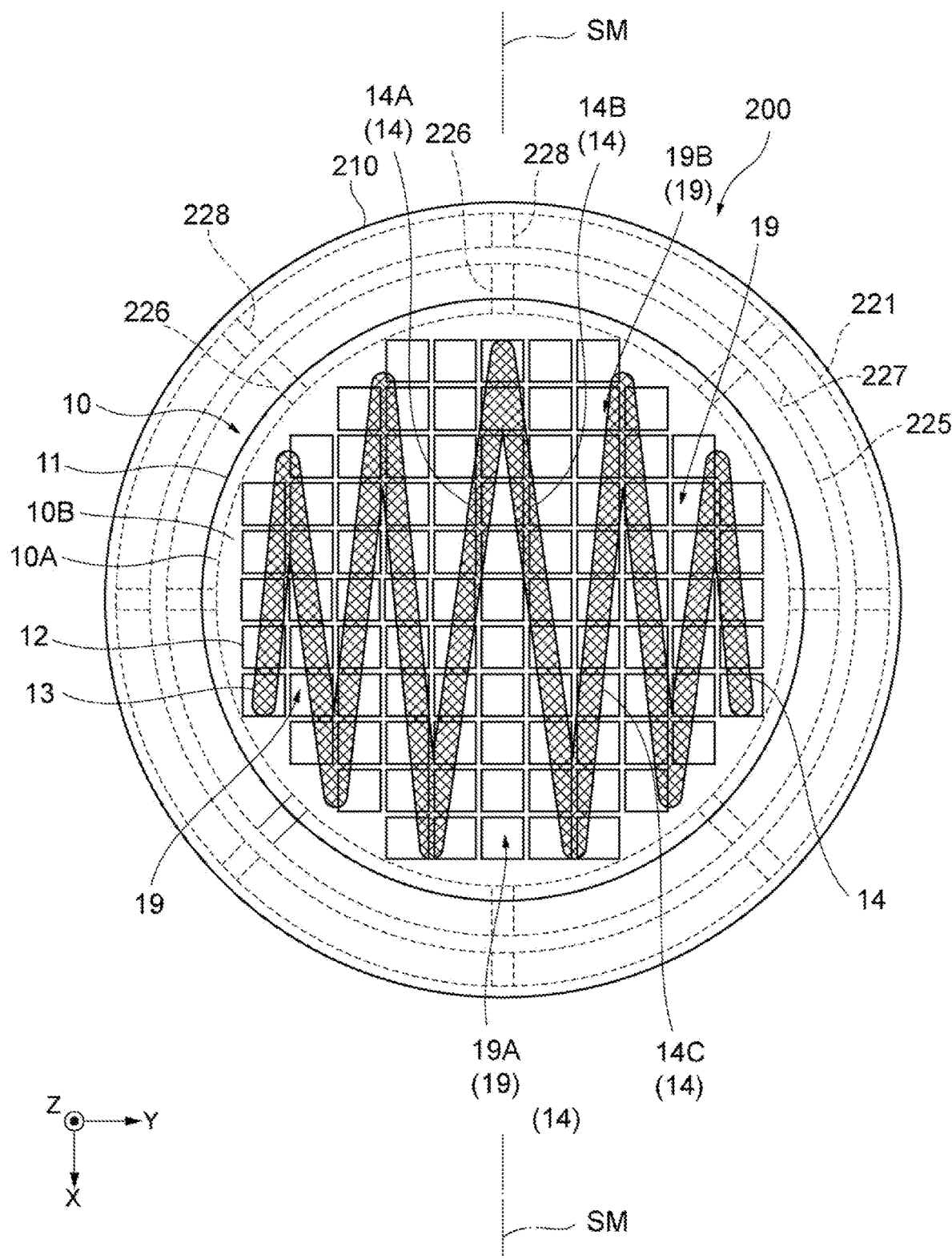
FIG. 2 is a plan view schematically showing a workpiece and a resin supply pattern in a resin sealing mold.

A configuration of a resin sealing apparatus 1 according to an embodiment of the present invention is described with reference to FIGS. 1 and 2. FIG. 1 is a diagram schematically showing a configuration of a resin sealing apparatus according to a first embodiment. FIG. 2 is a plan view schematically showing a workpiece and a resin supply pattern in a resin sealing mold.

Each drawing may be assigned with a Cartesian coordinate system including X-axis, Y-axis and Z-axis for convenience to clarify the relationship between the drawings and to help understand the positional relationship between members. The direction of the Z-axis arrow is an upward direction, and the direction opposite to the direction of the Z-axis arrow is a downward direction.

The resin sealing apparatus 1 is an apparatus used for resin-sealing (molding) a workpiece 10 with a resin 13. The resin sealing apparatus 1 includes a resin supply apparatus 100 that applies (supplies) the resin 13 for resin sealing onto an object to be coated (for example, the workpiece 10 or a release film RF), and a resin sealing mold 200 that heats and pressurizes the resin for curing. The workpiece 10 includes, for example, a substrate 11 and elements 12 arranged on the substrate 11, and the elements 12 are arranged in a first direction X and a second direction Y, respectively. In the following description, in a plan view of the workpiece 10 from a positive direction (hereinafter referred to as "upward direction") side of a third direction Z, a region from an edge of the substrate 11 to an element 12 at the outermost edge is referred to as "external region of the workpiece 10". In the external region of the workpiece 10, a region sandwiched by the resin sealing mold 200 is referred to as "external region 10A", and a region closer to the element 12 side than the external region 10A is referred to as "external region 10B".

The configurations of the substrate 11 and the element 12 are not limited. As an example, the substrate 11 may be a semiconductor wafer, and the element 12 may be a semiconductor chip flip-chip mounted on the substrate 11. In this case, a gap is present between the substrate 11 and the element 12 when the resin 13 is supplied, but the resin is filled in this gap by heating and pressurizing. The present invention is not limited to this aspect, and may also be applied when, for example, the element 12 is simply mounted on the substrate 11 without a gap therebetween, or when an underfill resin is filled between the substrate 11 and the element 12. In addition, the element 12 may be a multilayer body in which a plurality of semiconductor chips are laminated at intervals in the third direction Z, or may be an element other than a semiconductor element (MEMS device, electronic device, or the like). The arrangement of the element 12 on the substrate 11 is not limited. For example, the element 12 may be wire-bonded to the substrate 11, or may be detachably fixed to the substrate 11. The substrate 11 may be a resin substrate or a glass substrate, or may be an interposer substrate, a lead frame, a carrier plate with an adhesive sheet, or the like. In a plan view of the workpiece 10 from above, for example, the planar shape of the substrate 11 is circular and the planar shape of the element 12 is rectangular, but the planar shapes of the substrate 11 and the element 12 are not limited thereto. For example, the planar shape of the substrate may be rectangular, and the planar shape of the element may be polygonal or circular. Two or more types of elements having different shapes may be arranged on the workpiece.

The resin supply apparatus 100 includes an acquisition unit 110, a supply unit 120, a calculation unit 130, a drive unit 140, and a stage 150.

The acquisition unit 110 acquires structural information (for example, information about the shape, size, and the like of a cavity 201) of the cavity 201 constituting an internal space of the resin sealing mold 200 that is filled with the resin 13. The acquisition unit 110 acquires the structural information by input from, for example, an external terminal or the like. The method for acquiring the structural information of the cavity 201 is not limited to the above method. For example, the acquisition unit 110 may read a code or the like assigned to the resin sealing mold 200, and thereby acquire structural information corresponding to the code or the like from a database recorded in advance.

The acquisition unit 110 acquires arrangement information (for example, information about the shape, size, arrangement direction, number, interval, and the like of the elements 12) of the elements 12 on the workpiece 10 (more specifically, the substrate 11) in addition to the structural information of the cavity 201. For example, the acquisition unit 110 acquires the arrangement information of the elements 12 by imaging the workpiece 10 and analyzing the image of the workpiece 10. The acquisition unit 110 may acquire the arrangement information for each workpiece, or may acquire the arrangement information for each lot having a plurality of workpieces. Note that, the method for acquiring the arrangement information of the elements 12 is not limited to the above method. For example, the acquisition unit 110 may read a code or the like assigned to the workpiece 10, and thereby acquire arrangement information corresponding to the code or the like from a database recorded in advance. In addition, the acquisition unit 110 may acquire the arrangement information by inputting from the external terminal or the like. Additionally, the acquisition unit 110 may detect a position of a V notch or the like in the workpiece 10 such as a wafer to acquire the orientation of the workpiece 10. The resin supply apparatus 100 can also supply the resin 13 described later after adjusting the orientation of the workpiece 10 based on the orientation of the workpiece 10 acquired by the acquisition unit 110.

The supply unit 120 supplies the resin 13 onto the object to be coated (the workpiece 10 or the release film RF). The supply unit 120 is, for example, a dispenser for discharging the liquid resin 13. The supply unit 120 includes a syringe 121 in which the resin 13 is stored, a pusher (piston) 122 that is inserted inside the syringe 121 and can push out the resin 13, and a pinch valve 123 that opens or closes a nozzle at the front end of the syringe 121. The supply unit 120 is provided with a configuration in which the used syringe 121 can be replaced with a new syringe 121 when the resin 13 stored in the syringe 121 is used up. Note that, the supply unit 120 is not limited to the above configuration, and may include a switching valve instead of the pinch valve 123. In addition, the supply unit 120 may be configured to prepare two liquids separately and mix and supply them on site. For example, the supply unit 120 may be a feeder for discharging powdery and granular resin.

The calculation unit 130 calculates the resin supply pattern (the shape of the resin 13 applied on the object to be coated) based on the shape of the cavity 201 of the resin sealing mold 200 obtained from the acquisition unit 110. The resin supply pattern calculated by the calculation unit 130 has a plurality of linear paths 14 extending along the first direction X and arranged in the second direction Y.

As shown in FIG. 2, in a plan view of the workpiece 10 from above (hereinafter, simply referred to as "in a plan view"), the plurality of linear paths 14 are inclined with respect to an axis of symmetry SM that divides the cavity 201 in line symmetry. Because the axis of symmetry SM of the cavity 201 is parallel to the first direction X, the plurality of linear paths 14 are inclined from the first direction X toward the second direction Y, and an angle of inclination of the linear path 14 from the first direction X is an acute angle. Each of the mutually adjacent linear paths 14 is inclined in a direction opposite to the first direction X, and one of the mutually adjacent linear paths 14 is inclined with respect to the other linear path. That is, one of the mutually adjacent linear paths 14 approaches the other linear path as the one linear path is directed to a positive direction side or a negative direction side of the first direction X.

For example, on the side on which one of the mutually adjacent linear paths 14 approaches the other linear path, the end portions of the mutually adjacent linear paths 14 overlap. That is, the mutually adjacent linear paths 14 are connected to each other on the element 12 at the outermost edge of the workpiece 10, and are formed as one continuous linear line. The resin supply pattern is one continuous linear line as a whole, and the resin 13 can be supplied with one stroke in the entire resin supply pattern. In other words, the resin supply pattern is formed as one linear pattern by repeatedly folding back the inclined linear paths so as to make the inclined linear paths to be connected at the end portions. In addition, an angle formed by the mutually adjacent linear paths 14 is constant regardless of the position of the workpiece 10. Additionally, the mutually adjacent linear paths 14 extend to the element 12 at the outermost edge of the workpiece 10. Therefore, the resin 13 can be supplied to the entire workpiece 10.

In a plan view of the workpiece 10, a region 19 between the mutually adjacent linear paths 14 in the plurality of linear paths 14 is opened to the outside of the workpiece 10, on a side on which one of the mutually adjacent linear paths 14 is separated from the other linear path. On a side opposite to the side on which the region 19 is opened to the outside of workpiece 10, the region 19 between the mutually adjacent linear paths 14 is blocked by the linear paths 14 that are connected to each other.

A corner portion of the resin supply pattern may have a sharp shape or an R shape.

The resin supply pattern is described more specifically by taking a first linear path 14A, a second linear path 14B adjacent to the first linear path 14A, and a third linear path 14C adjacent to the second linear path 14B as examples. In a plan view of the workpiece 10, the first linear path 14A and the third linear path 14C are inclined at an acute angle in a clockwise direction from the first direction X, and the second linear path 14B is inclined counter clockwise from the first direction X. The second linear path 14B approaches the first linear path 14A on the negative direction side of the first direction and approaches the third linear path 14C on the positive direction side of the first direction X. The end portions of the first linear path 14A and the second linear path 14B on the negative direction side of the first direction X are overlapped on the element 12 at the outermost edge, and the end portions of the second linear path 14 B and the third linear path 14C on the positive direction side of the first direction X are overlapped on the element 12 at the outermost edge. In other words, the second linear path 14B is connected to the first linear path 14A at an end portion on a side approaching the first linear path 14A (the negative direction side of the first direction X), and is connected to the third linear path 14C at an end portion on a side approaching the third linear path 14C (the positive direction side of the first direction X). The resin 13 can be supplied with one stroke along the first linear path 14A, the second linear path 14B, and the third linear path 14C. An angle formed by the first linear path 14A and the second linear path 14B is substantially the same as an angle formed by the second linear path 14B and the third linear path 14C.

In a plan view of the workpiece 10, a region 19A between the first linear path 14A and the second linear path 14B is blocked on the negative direction side of the first direction X (the side on which the first linear path 14A approaches the second linear path 14B), and is opened to the outside of the workpiece 10 on the positive direction side of the first direction X (the side on which the first linear path 14A is separated from the second linear path 14B). In contrast, a region 19B between the second linear path 14B and the third linear path 14C is blocked on the positive direction side of the first direction X (the side on which the third linear path 14C approaches the second linear path 14B), and is opened to the outside of the workpiece 10 on the negative direction side of the first direction X (the side on which the third linear path 14C is separated from the second linear path 14B). The region 19A between the first linear path 14A and the second linear path 14B is continuous in the first direction X, rather than being partitioned by other portions of the resin supply pattern. The region 19B between the second linear path 14B and the third linear path 14C is also continuous in the first direction X.

The drive unit 140 moves the supply unit 120 with respect to the fixed workpiece 10 along the resin supply pattern. Specifically, the drive unit 140 includes an upper base portion 141, a first motor 142M, a first moving portion 142, a second motor 143M, a second moving portion 143, a third motor 144M, a third moving portion 144 and a fourth motor 122M.

The first moving portion 142 is configured to be movable in the first direction X relative to the upper base portion 141, the second moving portion 143 is configured to be movable in the second direction Y relative to the first moving portion 142, and the third moving portion 144 is configured to be movable in the third direction Z relative to the second moving portion 143. Specifically, the upper base portion 141 has a rail, and the first moving portion 142 has a slider that slides on the rail of the upper base portion 141 by being driven by the first motor 142M. The first moving portion 142 has a rail, and the second moving portion 143 has a slider that slides on the rail of the first moving portion 142 by being driven by the second motor 143M. The second moving portion 143 has a rail, and the third moving portion 144 has a slider that slides on the rail of the second moving portion 143 by being driven by the third motor 144M. The syringe 121 of the supply unit 120 is fixed to the third moving portion 144. The third moving portion 144 has a rail, and a pusher 122 of the supply unit 120 has a slider that slides on the rail of the third moving portion 144 by being driven by the fourth motor 122M. That is, the first motor 142M controls the moving amount and moving speed of the supply unit 120 in the first direction X, the second motor 143M controls the moving amount and moving speed of the supply unit 120 in the second direction Y, and the third motor 144M controls the moving amount and moving speed of the supply unit 120 in the third direction Z. Besides, the fourth motor 122M controls the discharge amount and discharge speed of the resin 13 from the supply unit 120 by controlling the moving amount and moving speed of the pusher 122.

Moreover, the drive unit 140 is not limited to the above, and at least one of the workpiece 10 and the supply unit 120 may be moved relative to the other along the resin supply pattern. For example, the drive unit 140 may fix the supply unit 120 and move the stage 150 on which the workpiece 10 is placed relative to the supply unit 120, or may move both the workpiece 10 and the supply unit 120.

The workpiece 10 is placed on the stage 150. The stage 150 includes, for example, a weighing scale. The resin supply apparatus 100 adjusts the amount of supply of the resin 13 while measuring, by the weighing scale of the stage 150, the weight of the resin 13 supplied onto the workpiece 10. Specifically, the drive of the first motor 142M to the fourth motor 122M of the drive unit 140 is changed based on the weighing result of the weighing scale. With the above configuration, the resin 13 can be supplied onto the workpiece 10 in an arbitrary shape and in an arbitrary amount by moving the syringe 121 at an arbitrary moving speed while supplying the resin 13 at an arbitrary discharge speed. For example, if the moving speed in the first direction X and the second direction Y is increased, the amount of supply within a predetermined length can be reduced even at the same discharge speed, and if the moving speed in the first direction X and the second direction Y is decreased, the amount of supply within a predetermined length can be increased even at the same discharge speed.

The resin sealing mold 200 includes a pair of molds (a lower mold 210 and an upper mold 220) for sealing the workpiece 10 with a resin by using compression molding technique. In the present embodiment, the resin sealing mold 200 has an upper mold cavity structure in which the cavity 201 is arranged inside the upper mold 220. In addition, the resin sealing mold 200 includes a sealing ring 203 (for example, an O-ring) for sealing the inside of the resin sealing mold 200 (the space between the lower mold 210 and the upper mold 220). Moreover, although not shown, the resin sealing apparatus 1 includes a pressure adjusting portion (for example, a vacuum pump) for adjusting the internal pressure of the resin sealing mold 200, and a temperature adjusting portion (for example, a heater) for adjusting the internal temperature (molding temperature).

The upper mold 220 includes a chase 221, a cavity piece 223, a clamper 225 surrounding the cavity piece 223, and a chamber block 227 surrounding the clamper 225 at an interval. The cavity piece 223 is fixed to the chase 221. The clamper 225 protrudes from the cavity piece 223 toward the lower mold 210 and constitutes the cavity 201 together with the cavity piece 223. The clamper 225 is connected to the chase 221 via a spring and is configured to be slidable with respect to the cavity piece 223. When the mold is clamped, the external region 10A of the workpiece 10 is sandwiched between the clamper 225 and the lower mold 210. On the lower surface of the clamper 225 (the surface facing the lower mold 210), a plurality of recessed air vents 226 that connect the space on the chamber block 227 side and the cavity 201 are arranged. The plurality of air vents 226 extend radially around the cavity 201. The air in the cavity 201 is discharged through the air vents 226 between the clamped upper mold 220 and lower mold 210. Note that, in each drawing, the air vent 226 is illustrated as having a deep depth for the sake of understanding, but in fact, the air vent 226 is formed to have a depth (for example, about several micrometres) at which the air or gas in the mold is discharged but the resin 13 does not flow out. Exhaust holes 228 connected to a pump to discharge air in the cavity 201 are arranged in a portion of the chamber block 227. The exhaust holes 228 of the chamber block 227 extend radially around the cavity 201. The sealing ring 203 is sandwiched between the chamber block 227 and the lower mold 210.

In the clamped resin sealing mold 200, at least one of the plurality of air vents 226 may be arranged on an extension line of the region 19 between the mutually adjacent linear paths 14 in the plurality of linear paths 14. For example, as shown in FIG. 2, the air vents 226 are arranged on an extension line of the region 19A between the first linear path 14A and the second linear path 14B.

Figure 3:
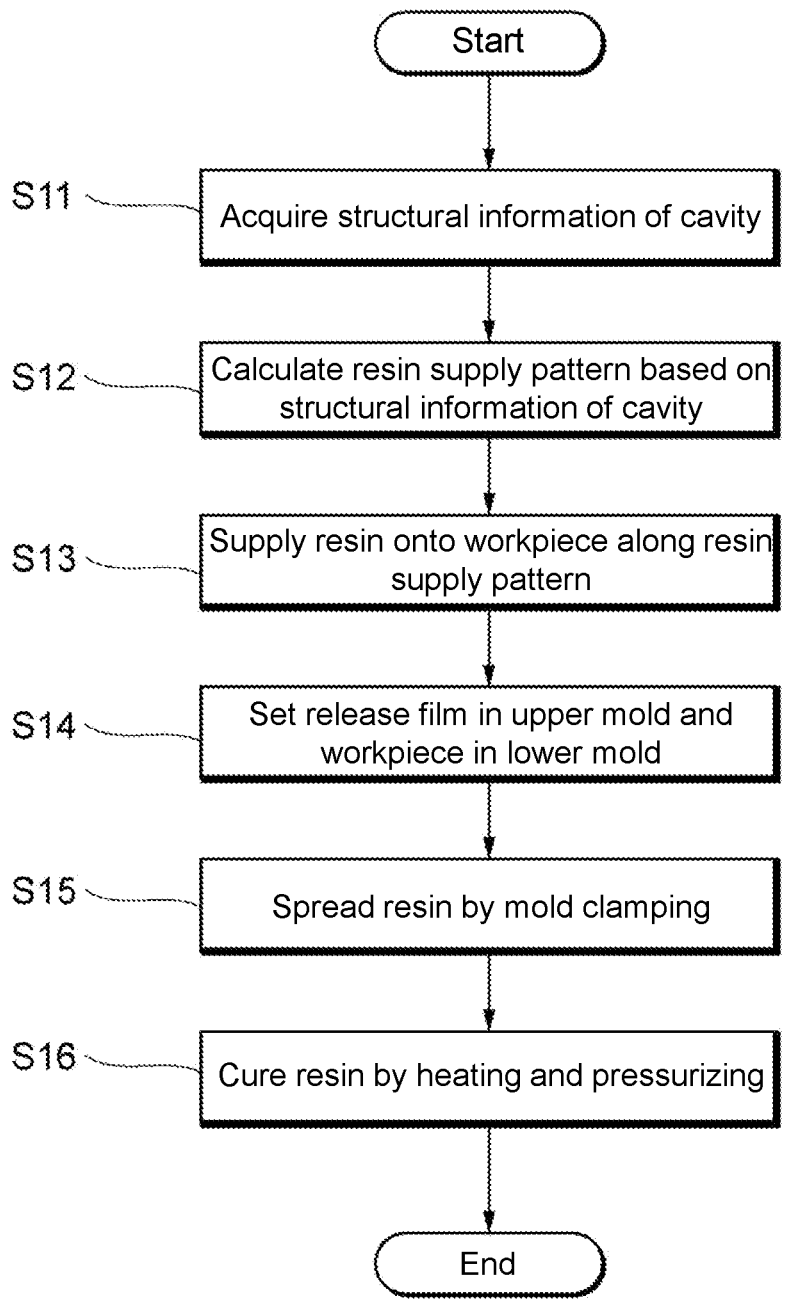
FIG. 3 is a flowchart showing a method for manufacturing a resin-sealed product using the resin sealing apparatus according to the first embodiment.
Figure 4:
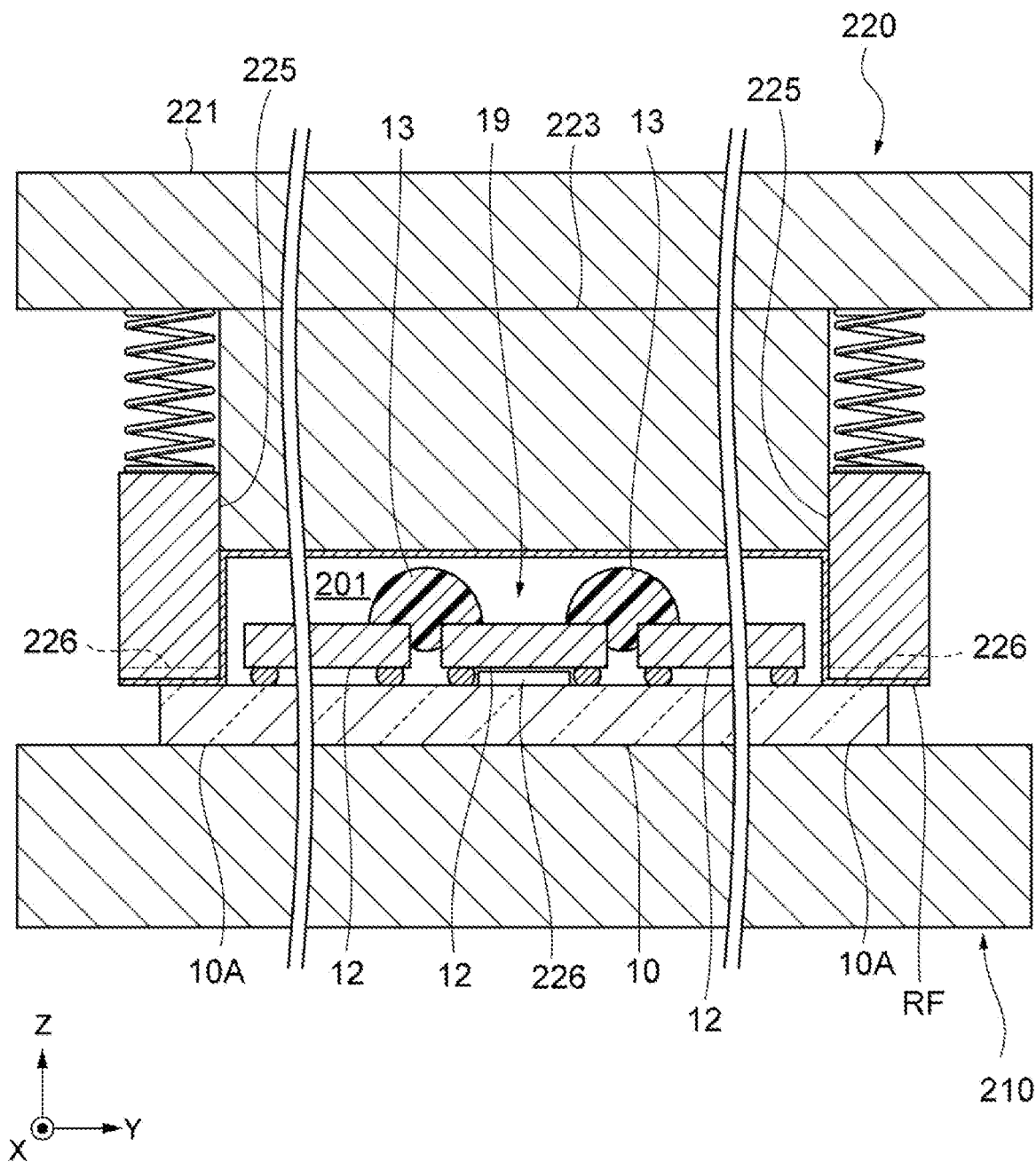
FIG. 4 is a cross-sectional view schematically showing a resin on a workpiece immediately after being set inside the resin sealing mold.
Figure 5:
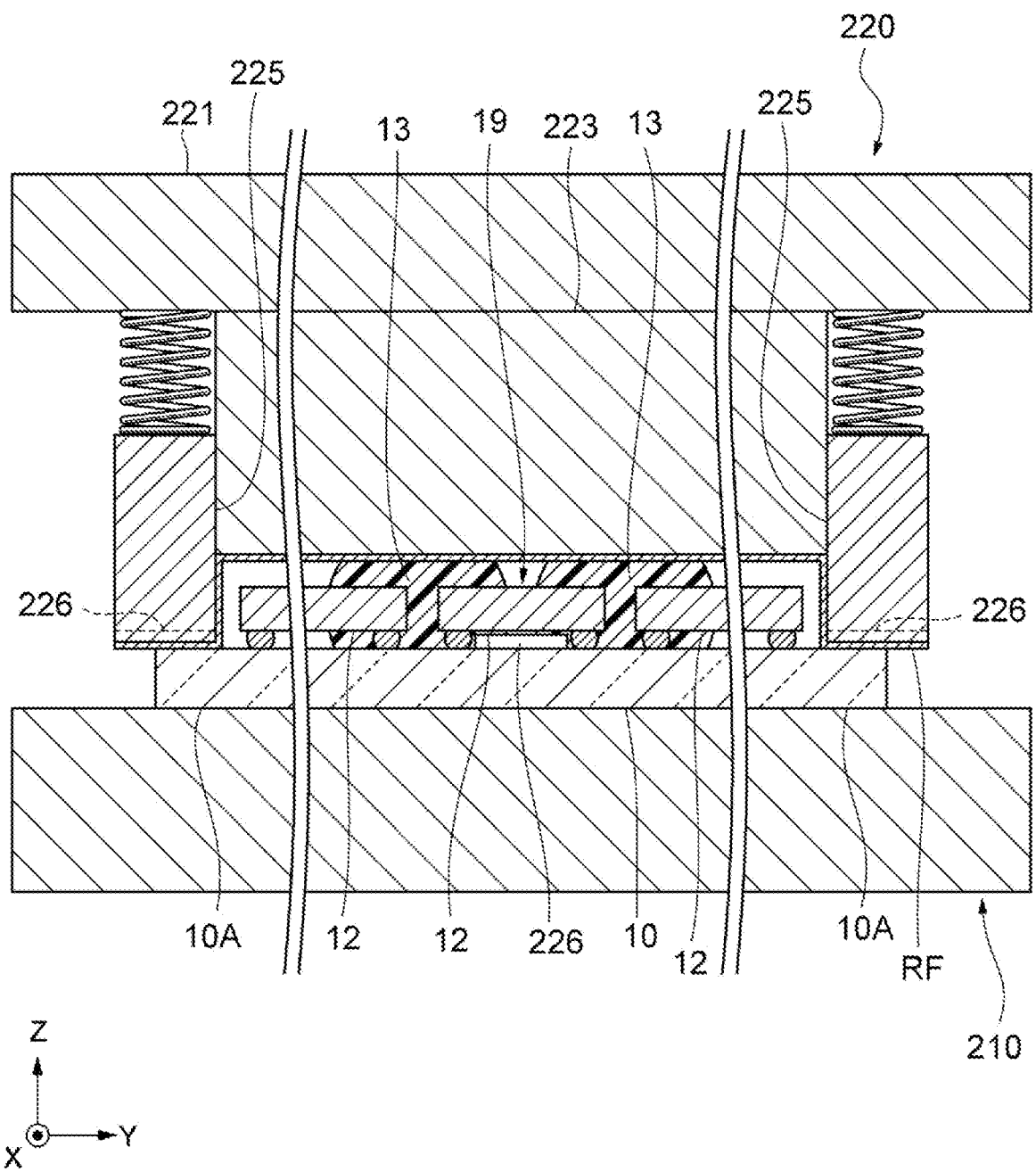
FIG. 5 is a cross-sectional view schematically showing a resin being spread by the resin sealing mold.
Figure 6:
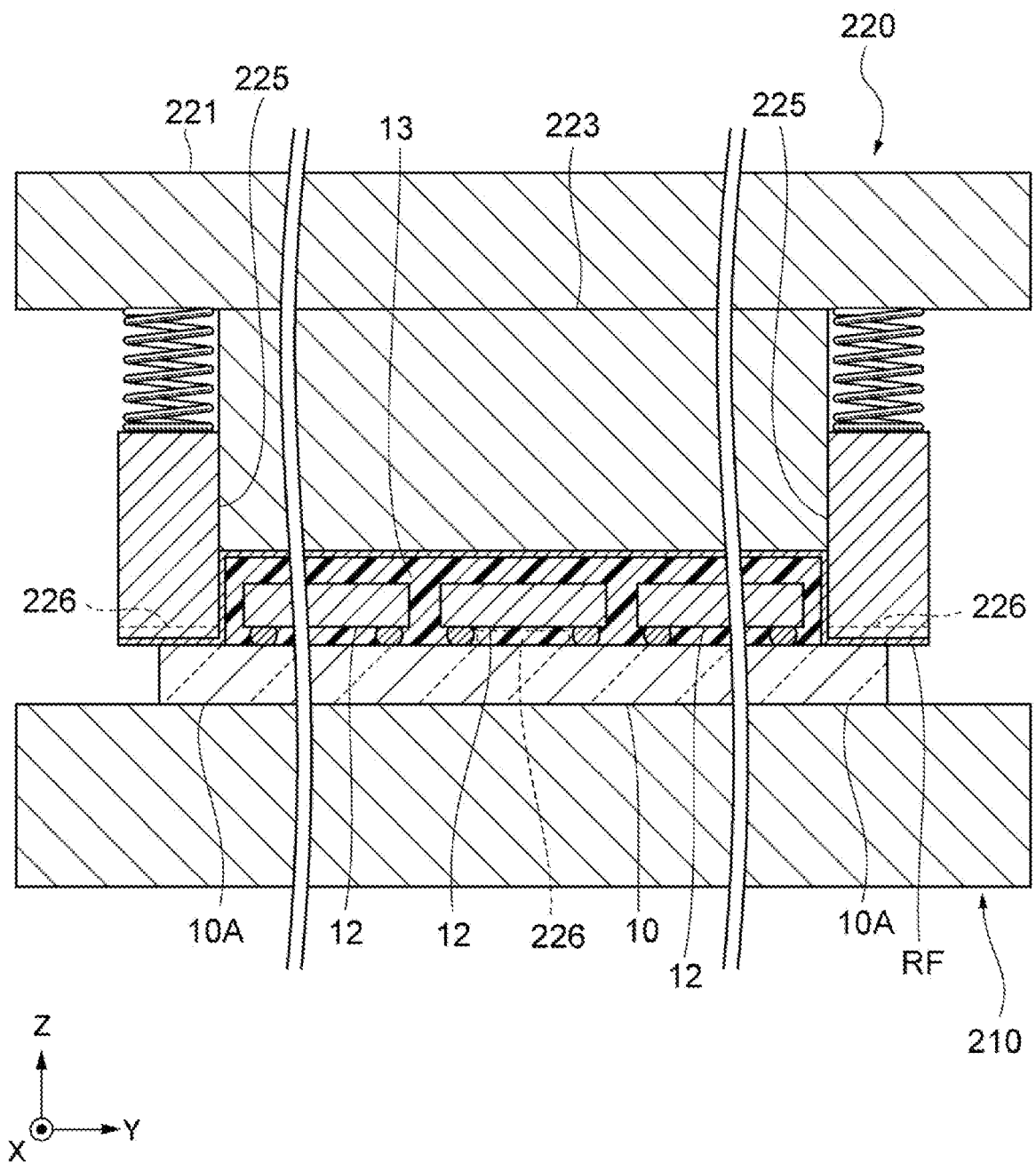
FIG. 6 is a cross-sectional view schematically showing a resin filled in a cavity by heating and pressurizing.

Next, a method for manufacturing a resin-sealed product using the resin sealing apparatus 1 according to the present embodiment is described with reference to FIGS. 3 to 6. FIG. 3 is a flowchart showing a method for manufacturing a resin-sealed product using the resin sealing apparatus according to the first embodiment. FIG. 4 is a cross-sectional view schematically showing a resin on the workpiece immediately after being set inside the resin sealing mold. FIG. 5 is a cross-sectional view schematically showing a resin being spread by the resin sealing mold. FIG. 6 is a cross-sectional view schematically showing a resin filled in the cavity by heating and pressurizing. Note that, for simplicity of explanation, the chamber block 227 is not shown in FIGS. 4 to 6.

First, the structural information of the cavity 201 is acquired (S11). For example, the model number of the resin sealing mold 200 used is input to the acquisition unit 110 from the external terminal, and the structural information of the cavity 201 corresponding to the model number is acquired from the database. At this time, the arrangement information of the elements 12 on the workpiece 10 can also be acquired from the acquisition unit 110. For example, the acquisition unit 110 acquires the arrangement information of the elements 12 arranged in the first direction X and the second direction Y by imaging the workpiece 10 and analyzing the image of the workpiece 10.

Next, the resin supply pattern is calculated based on the structural information of the cavity 201 (S12). For example, the calculation unit 130 calculates, based on the structural information of the cavity 201 registered by the acquisition unit 110, the resin supply pattern according to pre-registered rules (for example, the angle of inclination of the linear path 14 with respect to the axis of symmetry SM of the cavity 201, the thickness and length of the linear path 14, and the like), and determines desirable moving route, moving speed, and the like of the supply unit 120. Moreover, the structural information of the cavity 201 includes the inner peripheral dimension of the cavity, the depth of the cavity at the time of final molding, and the like.

Then, the resin 13 is supplied onto the workpiece 10 along the resin supply pattern (S13). Here, the supply unit 120 is moved relative to workpiece 10 by driving the drive unit 140 based on the resin supply pattern in a state that the workpiece 10 is positioned in the first direction X, the second direction Y, and the rotation direction centered on the Z axis. When the supply unit 120 moves to a supply start position (one end of the resin supply pattern), the pinch valve 123 is opened while pushing the pusher 122 against the syringe 121, and the supply of the resin 13 is started. When the supply unit 120 that continues to supply the resin 13 is moved to a supply end position (the other end of the resin supply pattern) along the resin supply pattern, the pinch valve 123 is closed while the pushing of the pusher 122 against the syringe 121 is stopped, and the supply of the resin 13 is ended.

Subsequently, the release film RF is set in the upper mold 220, and the workpiece 10 is set in the lower mold 210. The release film RF is carried into the opened resin sealing mold 200 so as to cover the cavity 201. The release film RF may be supplied, for example, by being fed out from a roll of unused film arranged in front of the mold and wound by a roll of used film arranged at the rear of the mold. After discharging air from a gap between the cavity piece 223 and the clamper 225 and an intake hole in the upper mold 220 (not shown), the release film RF is adsorbed to the upper mold 220. In addition, the workpiece 10 to which the resin 13 is supplied is carried into the opened resin sealing mold 200. The air is discharged from the intake hole in the upper mold 220 (not shown), the workpiece 10 is adsorbed to the lower mold 210.

Next, the resin 13 is spread by mold clamping (S15).

First, as shown in FIG. 4, for example, the external region 10A of the workpiece 10 having the flip-chip mounted elements 12 and the substrate 11 is sandwiched between the clamper 225 and the lower mold 210. At this time, although not shown, the sealing ring 203 is sandwiched between the chamber block 227 and the lower mold 210. A shallow dug portion arranged on the lower surface of the clamper 225 forms the air vent 226 between the lower mold 210 and the clamper 225 (between the workpiece 10 and the clamper 225), and the space (the cavity 201) inside the clamper 225 and the space outside the clamper 225 are connected through the air vent 226. Accordingly, the air in the mold shown in FIG. 4 is discharged to the outside of the chamber block 227.

Next, as shown in FIG. 5, the resin 13 is spread by the cavity piece 223 in the depressurized mold. At this time, the resin 13 can enter the gap between the element 12 and the release film RF as well as the gap between the workpiece 10 and the flip-chip mounted element 12 to perform underfill. In the process of spreading the resin 13, the resin 13 is filled in the region 19 between the mutually adjacent linear paths 14 from the side on which one linear path approaches the other linear path. On the workpiece 10, the region 19 between the mutually adjacent linear paths 14 is not divided until the filling of the resin 13 is completed, so that air can be discharged from the air vent 226.

Then, the cavity piece 223 is relatively lowered by performing mold clamping, and as shown in FIG. 6, the resin 13 spreads to the whole part the cavity 201, and fine spaces such as the gap between the element 12 and the substrate 11 or the like are also filled with the resin 13. Accordingly, the resin 13 is filled up to the front of the air vent 226. Here, by softening the resin 13 while heating it with a heater (not shown) and pressurizing the resin 13 with the cavity piece 223, the resin 13 is filled (molded) in the cavity, and at the same time, the gap between the workpiece 10 and the flip-chip mounted element 12 is underfilled with the resin 13.

Finally, the resin 13 is cured by continuing heating and pressurizing (curing) for a predetermined time (S16). In this way, the sealing of the workpiece 10 with a resin is completed.

According to the configuration described in the above embodiment, the resin supply pattern calculated by the calculation unit 130 based on the shape of the cavity 201 has a plurality of the linear paths 14, and one of the mutually adjacent linear paths 14 is inclined with respect to the axis of symmetry SM of the cavity 201, and the other linear path is inclined with respect to the one linear path. The region 19 between the mutually adjacent linear paths 14 is opened to the outside of the workpiece 10 at least on the side on which one of the adjacent linear paths 14 is separated from the other linear path. Accordingly, when the resin 13 is spread in the resin sealing mold 200 so as to seal the workpiece 10 with a resin, the air remaining inside the resin sealing mold 200 and the gas generated from the resin 13 can be discharged through the region 19. Therefore, it is possible to suppress the occurrence of defects (for example, air traps or non-filling) due to the containment of air or the like caused by the resin 13. Accordingly, when it is difficult for the resin 13 to enter a fine portion of the workpiece 10 due to the presence of air or the like, for example, the filling of the resin 13 into the gap between the flip-chip mounted element 12 and the substrate 11 is promoted and the occurrence of poor filling can be suppressed.

The second linear path 14B located between the first linear path 14A and the third linear path 14C is connected to an end portion of the first linear path 14A on one end portion and is connected to an end portion of the third linear path 14C on the other end portion. In addition, the resin supply pattern is one continuous linear line. Accordingly, by having a shape in which adjacent linear paths are not connected to each other at least on either end portion side, the resin 13 can be supplied with one stroke while discharging air. Therefore, the resin 13 can be efficiently supplied onto the workpiece 10 by continuously discharging the resin 13 without the need for stopping the discharge of the resin 13 during the supply.

The resin supply apparatus 100 may include the acquisition unit 110 for acquiring the shape of the workpiece 10, the arrangement information of the elements 12, and the like. The calculation unit 130 may calculate the resin supply pattern in consideration of the shape of the workpiece 10 and the arrangement information of the elements 12. Accordingly, the resin 13 can efficiently enter the fine space such as a gap between the substrate 11 and the element 12, or the like, and the occurrence of sealing failure can be suppressed.

The amount of supply of the resin 13 may be adjusted by taking into account the arrangement information of the elements 12. For example, the resin supply pattern may be calculated so that the amount of supply of the resin 13 in a region having a small ratio of the occupied area per unit area (hereinafter referred to as "area ratio") of the elements 12 on the workpiece 10 is greater than the amount of supply of the resin 13 in a region having a large area ratio of the elements 12. Accordingly, it is possible to suppress occurrence of defects caused by a shortage of the resin 13 when the resin 13 is heated and pressurized.

The mutually adjacent linear paths 14 extend to the element 12 at the outermost edge of the workpiece 10 and are connected to each other on the element 12 at the outermost edge. Accordingly, as compared with a resin supply pattern in which the mutually adjacent linear paths 14 are connected to each other on an element 12 which is on the inner side of the element 12 at the outermost edge, it is possible to suppress occurrence of defects caused by the shortage of the resin 13 in a space over the external region 10B of the workpiece 10 in which the required amount of the resin 13 is large due to the absence of the elements 12.

The air vent 226 is arranged on the extension line of the region 19 between the mutually adjacent linear paths 14. Accordingly, the air vent is not blocked until the region 19 between the mutually adjacent linear paths 14 is completely filled with the resin 13, and air can be discharged from the inside of the resin sealing mold 200.

In the present embodiment, the acquisition unit 110 acquires the arrangement information of the elements 12 and the structural information of the cavity 201. However, the acquisition unit 110 may acquire only the structural information of the cavity 201 without acquiring the arrangement information of the elements 12. In addition, the acquisition unit for acquiring the arrangement information of the elements 12 and the acquisition unit for acquiring the structural information of the cavity 201 may be arranged separately.

In addition, the resin supply pattern is not limited to the above. It is sufficient that at least one of the mutually adjacent linear paths 14 is inclined with respect to the axis of symmetry SM of the cavity 201, and one of the mutually adjacent linear paths 14 is inclined with respect to the other linear path. The mutually adjacent linear paths 14 may be connected to each other on the external region 10B of the workpiece 10. The mutually adjacent linear paths 14 may also extend to the element 12 which is on the inner side of the element 12 at the outermost edge of the workpiece 10 except for extending to the element 12 at the outermost edge, and the mutually adjacent linear paths 14 may be connected to each other on the element 12 which is on the inner side of the element 12 at the outermost edge. The mutually adjacent linear paths 14 may be separated from each other, and the region 19 between the mutually adjacent linear paths 14 may be opened to the outside of the workpiece 10 on both the positive direction side and the negative direction side of the first direction X. An angle formed by the mutually adjacent linear paths 14 at the center of the workpiece 10 in the second direction Y may be different from an angle formed by the mutually adjacent linear paths 14 at an end portion of the workpiece 10 in the second direction Y.

Hereinafter, a variation example of the resin supply pattern and a configuration of a resin sealing apparatus according to another embodiment of the present invention are described. It should be noted that the matters common to the first embodiment can also be applied to each of the following aspects, the description thereof is omitted, and only the differences are described. In particular, the same configurations are designated by the same reference signs, and the same configurations and the same actions and effects are not mentioned sequentially.

FIGS. 7 to 12 show schematic plan views of resin supply patterns according to different variation examples. As shown in FIGS. 7 to 12, external regions 20A, 30A, 40A, 50A, 60A, 70A are respectively referred to a region sandwiched by the resin sealing mold; external regions 20B, 30B, 40B, 50B, 60B, 70B are respectively referred to a region closer to the element 22, 32, 42, 52, 62, 72 side than the external regions 20A, 30A, 40A, 50A, 60A, 70A; reference numerals 21, 31, 41, 51, 61, 71 represent a substrate; reference numerals 23, 33, 43, 53, 63, 73 represent a resin; and reference numerals 29, 39, 49, 59, 69, 79 represent region between the linear paths.

Figure 7:
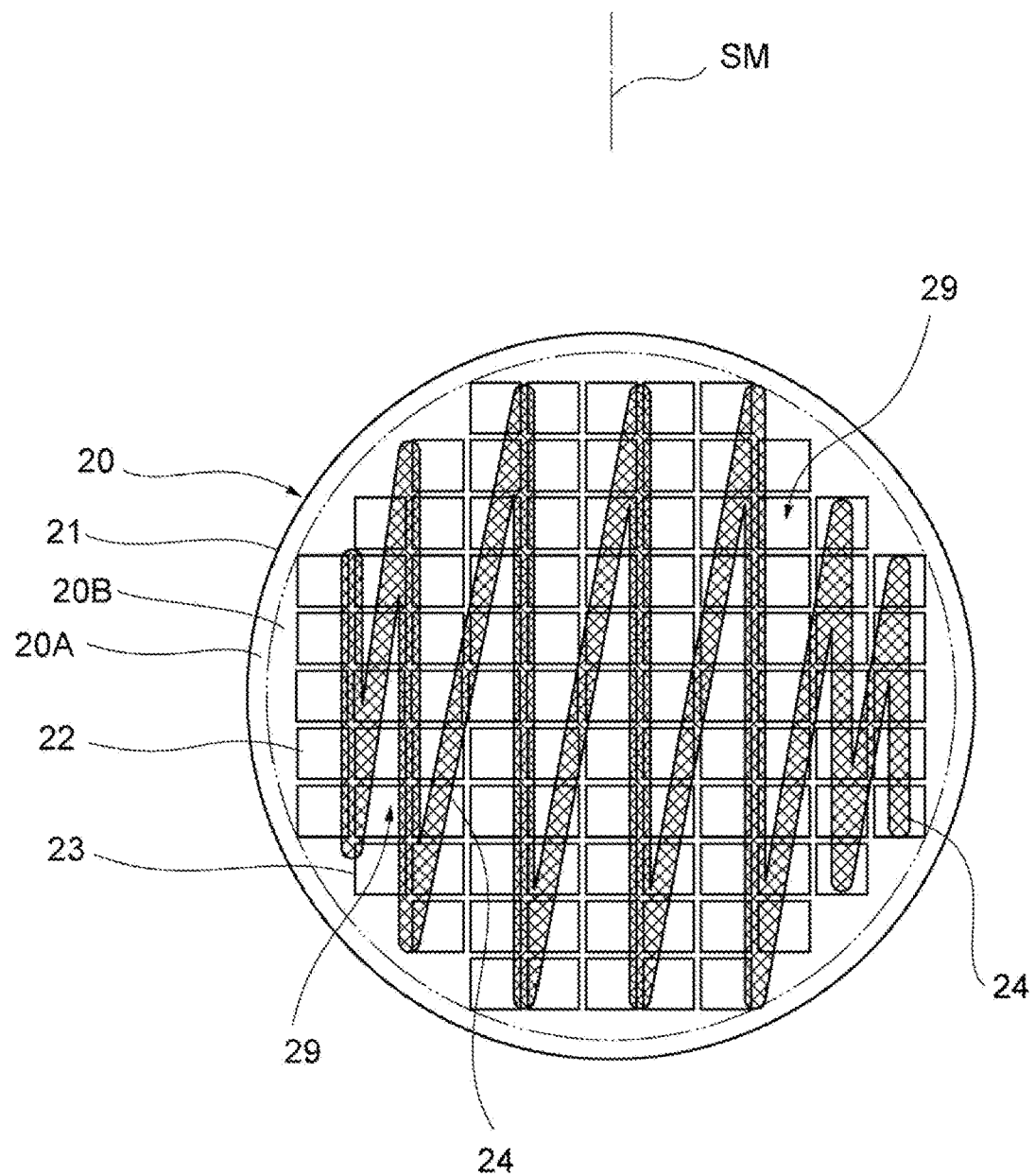
FIG. 7 is a plan view schematically showing a resin supply pattern according to a variation example.

As shown in FIG. 7, in a plan view of a workpiece 20, one of the mutually adjacent linear paths 24 in the plurality of linear paths 24 is inclined with respect to the axis of symmetry SM of the cavity, and the other linear path is inclined with respect to the one linear path and parallel to the axis of symmetry SM of the cavity.

Figure 8:
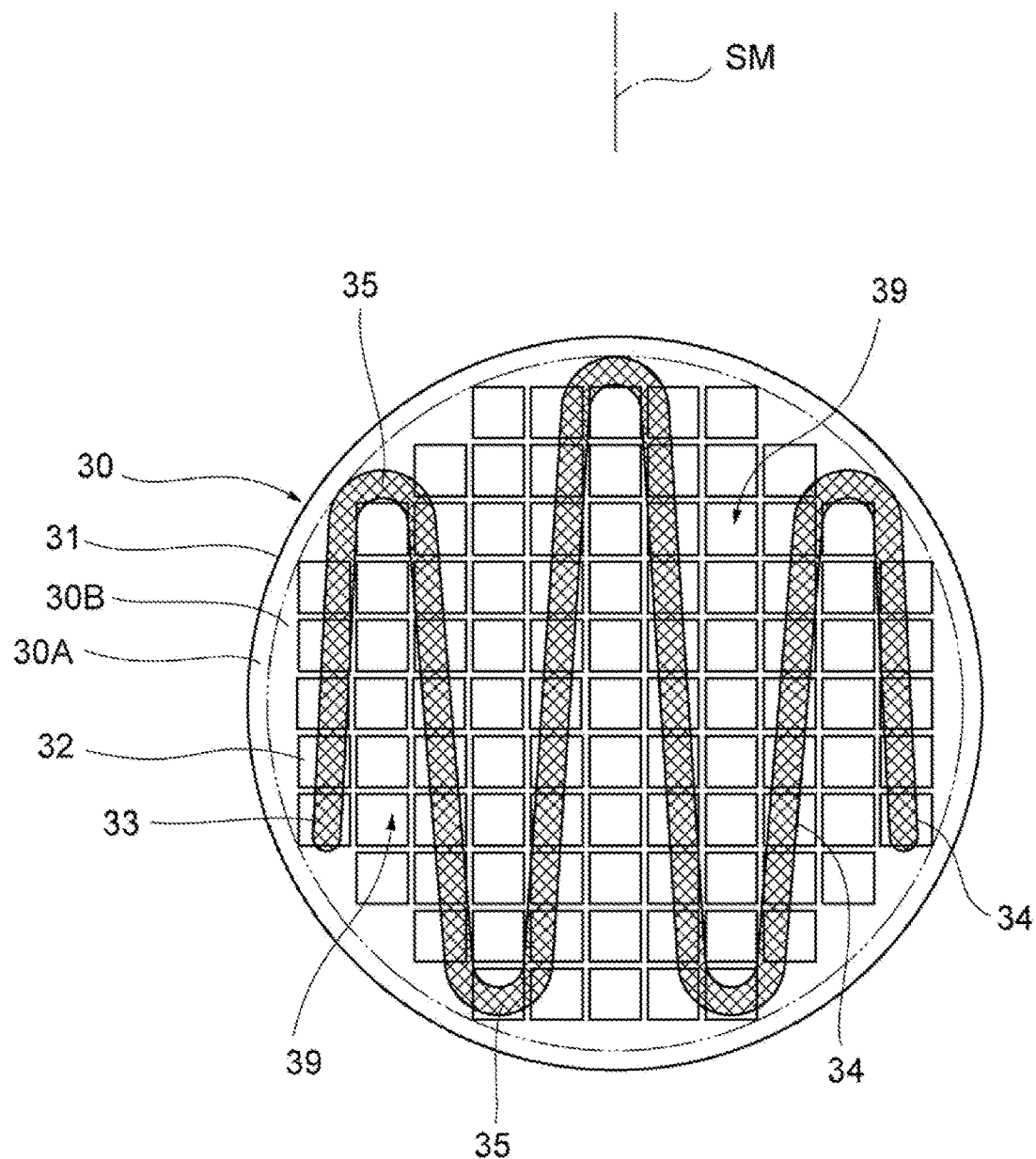
FIG. 8 is a plan view schematically showing a resin supply pattern according to another variation example.

As shown in FIG. 8, in a plan view of a workpiece 30, mutually adjacent linear paths 34 are connected by a relay path 35 extending in the second direction Y. The relay path 35 has, for example, an arc shape. By connecting the mutually adjacent linear paths 34 via the relay path 35, the degree of freedom in design regarding an interval between the mutually adjacent linear paths 34 and an angle formed by the mutually adjacent linear paths 34 is improved. Moreover, the relay path 35 is not limited to the above as long as the relay path 35 does not form a constriction in the region 39 between the mutually adjacent linear paths 34 and does not partition the region 39. For example, the relay path 35 is linear and may form a sharp shape at a connection portion with the linear path 34.

Figure 9:
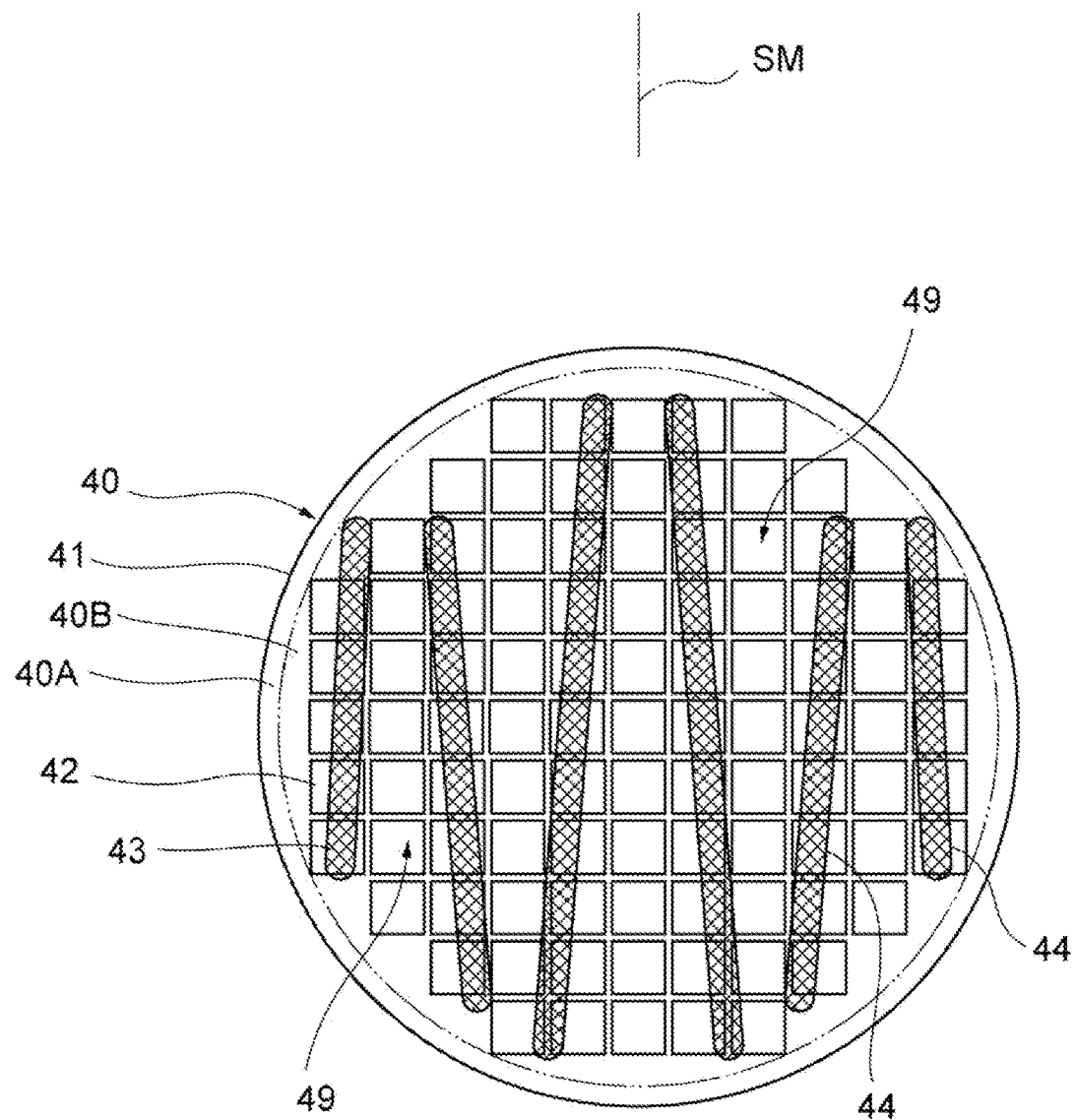
FIG. 9 is a plan view schematically showing a resin supply pattern according to another variation example.

As shown in FIG. 9, in a plan view of a workpiece 40, the mutually adjacent linear paths 44 are separated from each other. A region 49 between the mutually adjacent linear paths 44 is opened to the outside of the workpiece 40 on a side on which the other linear path approaches one of the mutually adjacent linear paths 44. That is, the region 49 between the mutually adjacent linear paths 44 is opened to the outside of the workpiece 40 on both the positive direction side and negative direction side of the first direction X that is parallel to the axis of symmetry SM of the cavity.

Figure 10:
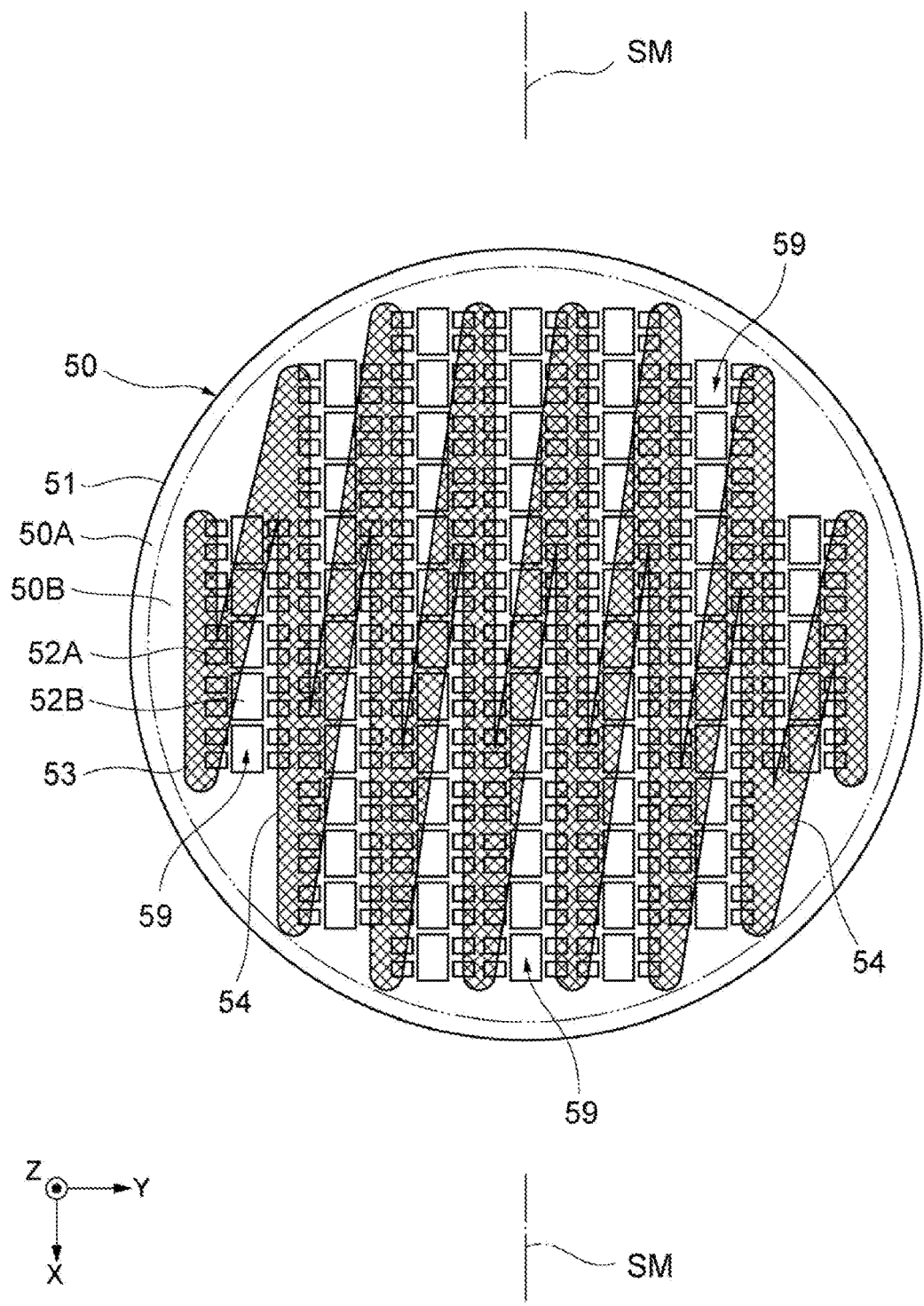
FIG. 10 is a plan view schematically showing a resin supply pattern according to another variation example.

As shown in FIG. 10, elements 52A and elements 52B larger than the elements 52A are arranged on a workpiece 50. The elements 52A are shorter than the elements 52B, and the area ratio of the elements 52A is smaller than the area ratio of the elements 52B. Thus, a region where the elements 52A are arranged requires more resin 53 than a region where the elements 52B are arranged. Therefore, by making a linear path 54 extending over the region where the elements 52A are arranged thicker than a linear path 54 extending over the region where the elements 52B are arranged, occurrence of defects caused by poor filling can be suppressed.

Figure 11:
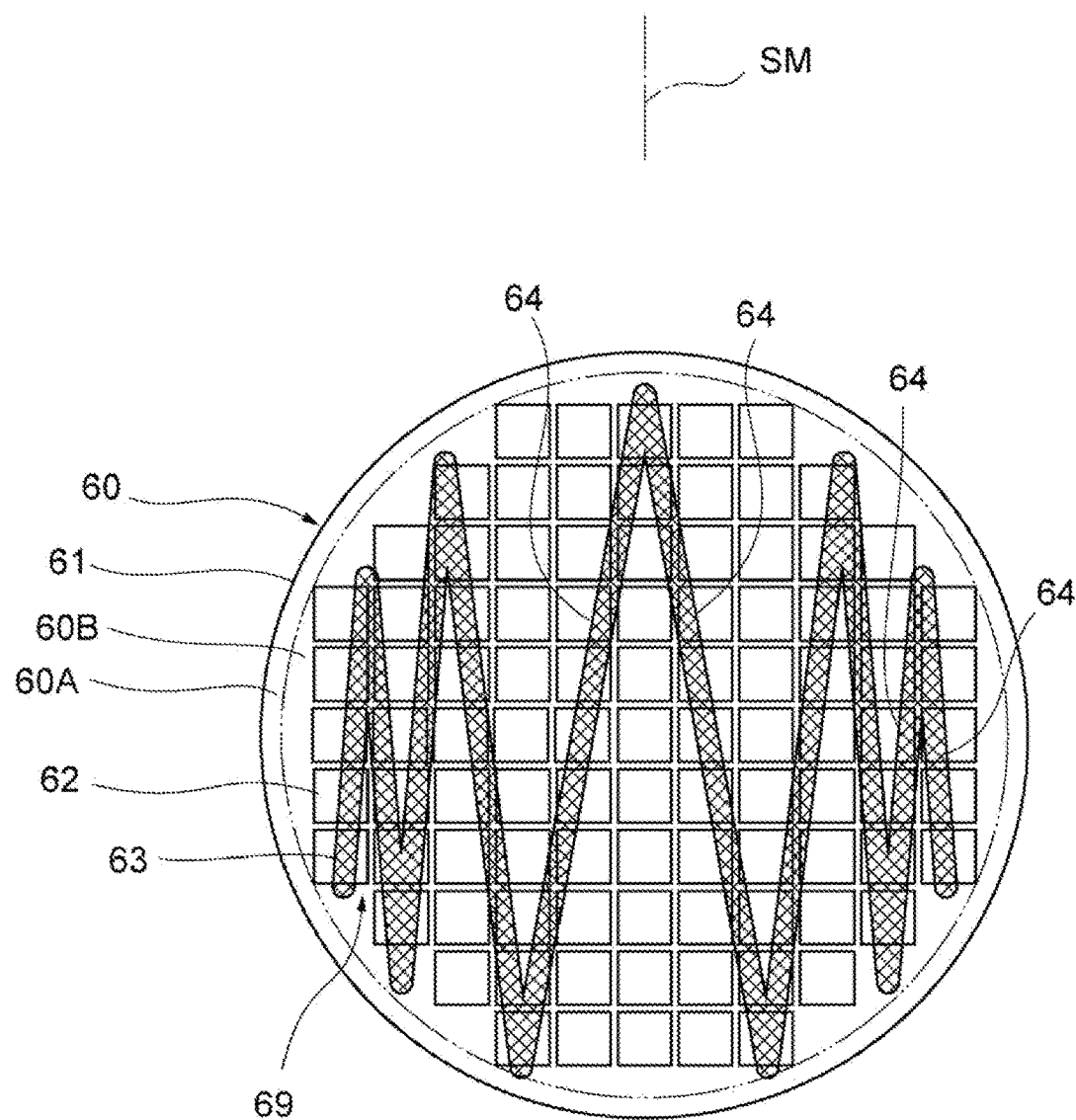
FIG. 11 is a plan view schematically showing a resin supply pattern according to another variation example.

As shown in FIG. 11, in a plan view of a workpiece 60, an angle formed by mutually adjacent linear paths 64 at the center of the workpiece 60 in the second direction Y is larger than an angle formed by the mutually adjacent linear paths 64 at an end portion of the workpiece 60 in the second direction Y. Accordingly, by making the amount of supply of the resin 63 at the end portion of the workpiece 60 that has a large external region 60B larger than the amount of supply of the resin 63 at the center of the workpiece 60 that has a small external region 60B, occurrence of defects caused by poor filling can be suppressed.

Figure 12:
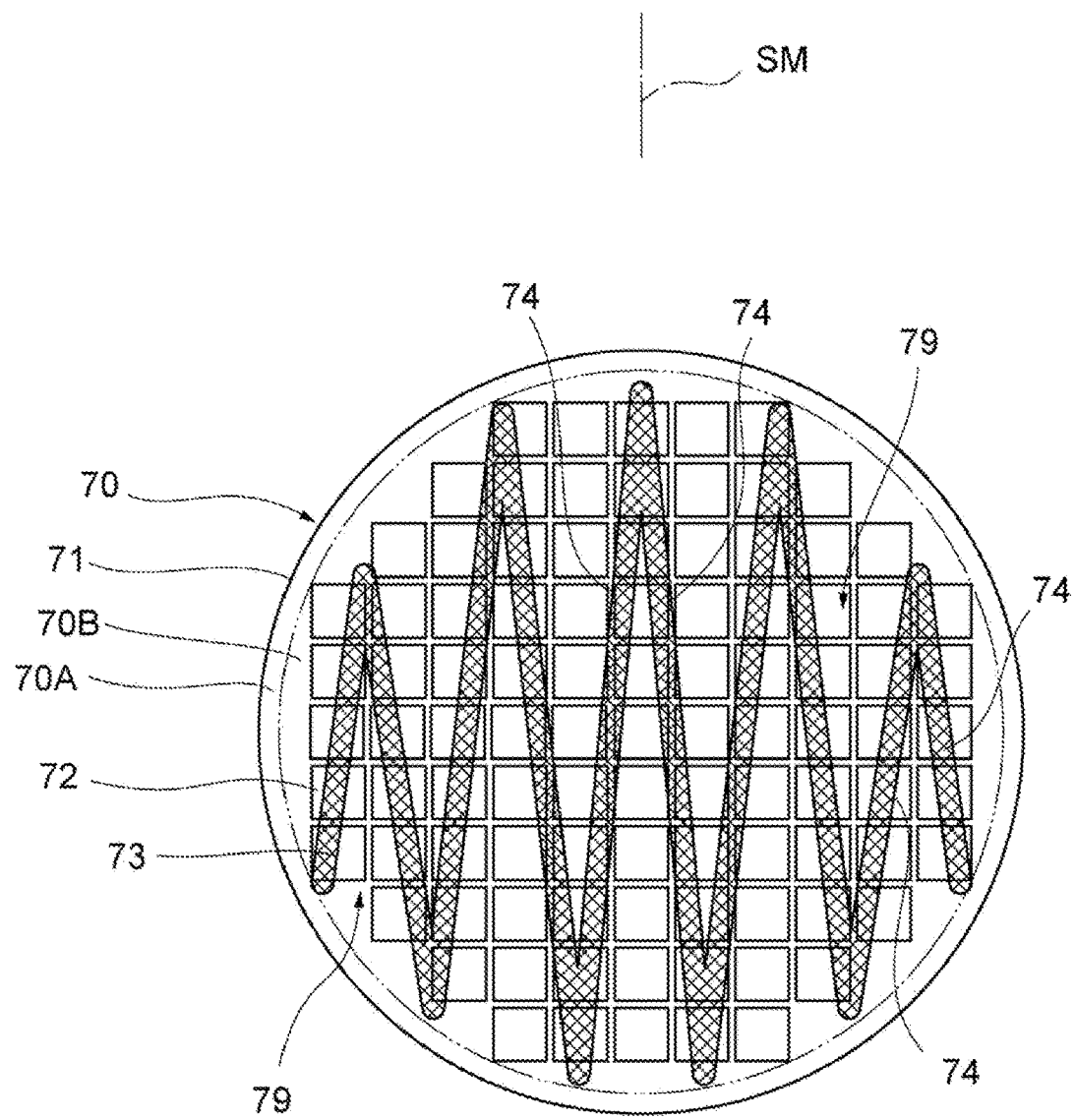
FIG. 12 is a plan view schematically showing a resin supply pattern according to another variation example.
Figure 12:

As shown in FIG. 12, in a plan view of a workpiece 70, an angle formed by the mutually adjacent linear paths 74 at the center of the workpiece 70 in the second direction Y is smaller than an angle formed by the mutually adjacent linear paths 74 at an end portion of the workpiece 70 in the second direction Y. Accordingly, the width of the open end of the region 79 between the mutually adjacent linear paths 74 at the center of the workpiece 70 is substantially the same as the width of the open end of the region 79 between the mutually adjacent linear paths 74 at the end portion of the workpiece 70. Thus, the occurrence of defects caused by poor filling can be suppressed by appropriately adjusting the width of the region 79 between the mutually adjacent linear paths 74.

Even in the variation examples of the first embodiment shown in FIGS. 7 to 12, the occurrence of defects caused by poor filling can be suppressed as in the first embodiment shown in FIG. 2. Moreover, the resin supply patterns of FIGS. 2 and 7 to 12 described above can be appropriately combined and applied to one workpiece.

Figure 13:
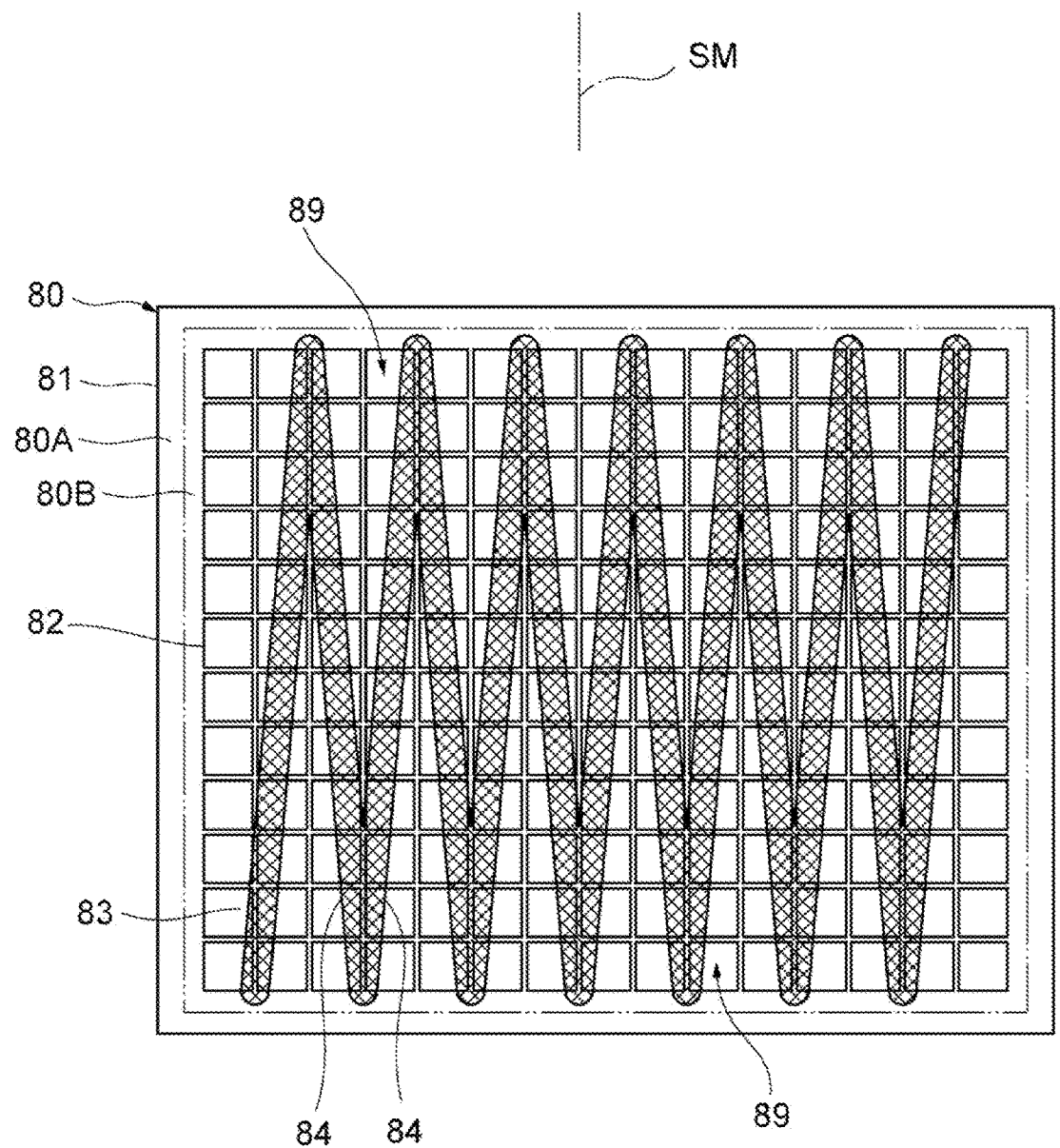
FIG. 13 is a plan view schematically showing a resin supply pattern according to another variation example.

FIG. 13 is a variation example of a workpiece, and shows a rectangular workpiece 10 for use in panel level packaging (PLP). As shown in FIG. 13, in a plan view of a workpiece 80, a substrate 81 (workpiece 80) has a rectangular shape having a pair of short sides and a pair of long sides. A linear path 84 extends along the short side of the substrate 81, and more specifically, the linear path 84 is inclined with respect to the short side of the substrate 81 and is arranged along the long side of the substrate 81. Accordingly, as compared with a configuration in which the linear path 84 extends along the long side of the substrate 81, the length of a region 89 between the mutually adjacent linear paths 84 is shortened, and the region 89 is blocked due to the contact between the resins 13 in the linear path 84 during the process of spreading a resin 83, and thus air can be suppressed from being caught in the resin 83. Further, the variation example shown in FIG. 13 can be appropriately applied to each of the above resin supply patterns. As shown in FIG. 13, external regions 80A is referred to a region sandwiched by the resin sealing mold; external regions 80B is referred to a region closer to the element 82 side than the external region 80A.

Second Embodiment

Figure 14:
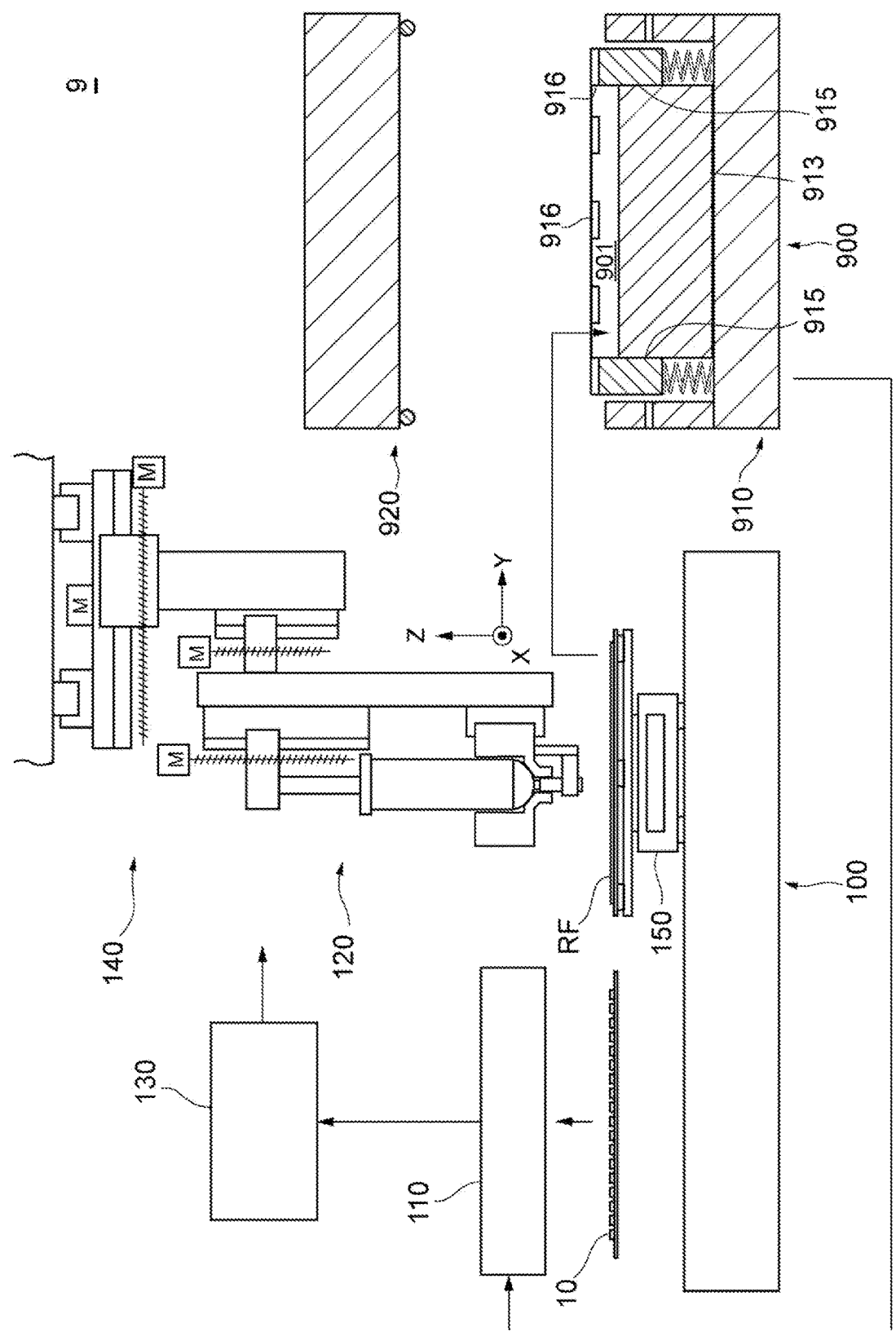
FIG. 14 is a diagram schematically showing a configuration of a resin sealing apparatus according to a second embodiment.

A configuration of a resin supply pattern according to a second embodiment is described with reference to FIG. 14. FIG. 14 is a diagram schematically showing a configuration of a resin sealing apparatus according to the second embodiment.

In the present embodiment, the object to be coated is a release film RF that delivers the supplied resin 13 to the workpiece 10. The release film RF is placed on the stage 150, and the drive unit 140 moves the supply unit 120 based on the information about the shape of a cavity 901 acquired by the acquisition unit 110, and the resin 13 is supplied onto the release film RF. A resin sealing mold 900 has a lower mold cavity structure which includes a lower mold 910 that has the cavity 901 and an upper mold 920. The release film RF is set in the lower mold 910, and the workpiece 10 is set in the upper mold 920. The lower mold 910 has a cavity piece 913 and a clamper 915 that constitutes the cavity 901, and an air vent 916 is arranged on the upper surface of the clamper 915 (the surface facing the upper mold 920) when the mold is clamped.

Figure 15:
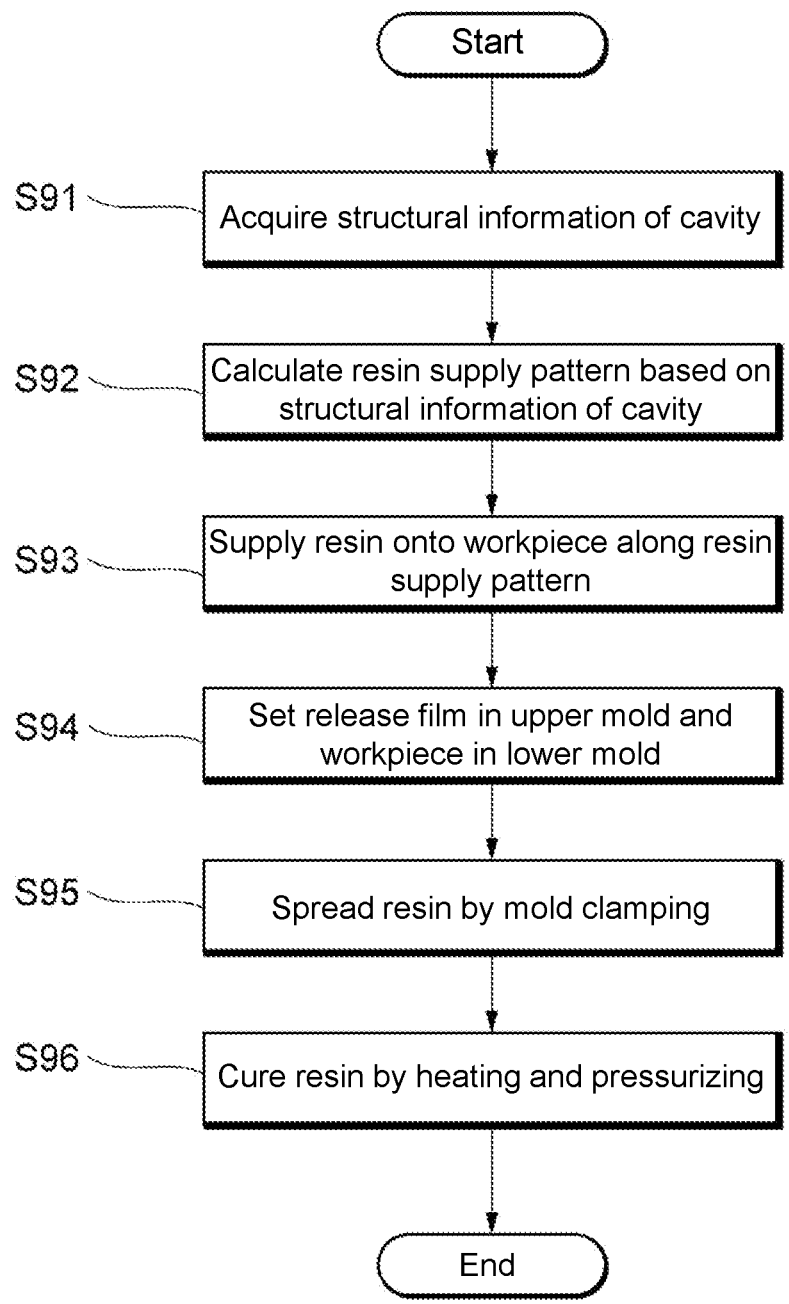
FIG. 15 is a flowchart showing a method for manufacturing a resin-sealed product using the resin sealing apparatus according to the second embodiment.

Next, a method for manufacturing a resin-sealed product using a resin sealing apparatus 9 according to the present embodiment is described with reference to FIG. 14. FIG. 15 is a flowchart showing a method for manufacturing a resin-sealed product using the resin sealing apparatus according to the second embodiment.

First, the structural information of the cavity 901 is acquired (S91). Next, the resin supply pattern is calculated based on the structural information of the cavity 901 (S92). When calculating the resin supply pattern in consideration of the arrangement information of the elements 12, take into account that the resin supply pattern on the release film RF is inverted on the workpiece 10. Then, the resin 13 is supplied onto the release film RF along the resin supply pattern (S93). Next, the release film RF is set in the lower mold 910, and the workpiece 10 is set in the upper mold 920 (S94). At this time, the release film RF and the workpiece 10 are positioned in the rotation directions centered on the first direction X, the second direction Y, and the Z axis, which can obtain effects similar to those obtained by supplying the resin 13 applied on the release film RF to a position corresponding to the elements 12 on the workpiece 10. Subsequently, by closing the mold, the resin 13 is brought into contact with the elements 12 and the substrate 11 while the air is discharged from the chamber of the mold, and the resin 13 is spread by mold clamping (S95). The resin 13 on the release film RF set in the lower mold 910 is pressed against the workpiece 10 set in the upper mold 920, and the resin 13 is spread while being sandwiched between the workpiece 10 and the release film RF. Here, it is considered that by discharging air before bringing the resin 13 into contact with the elements 12 or the substrate 11, air traps can be prevented even if a closed space is formed by the contact between the resins 13 on the release film RF. However, when the resin 13 is spread, the gas generated by heating the resin 13 remains, which may cause poor filling. In contrast, by arranging the path for discharging gas as in the present embodiment, the occurrence of defects such as an air trap caused by gas can be suppressed. Subsequently, the resin 13 is cured by heating and pressurizing (S96). In this way, the same effect as that of the above-described present invention can be obtained even when the mold has the lower mold cavity structure.

Further, in the aspect described in the embodiment, any one or an appropriate combination of a plurality of the resin supply patterns described in the first embodiment can be applied.

As described above, according to one aspect of the present invention, it is possible to provide a resin supply apparatus, a resin sealing apparatus, and a method for manufacturing a resin-sealed product, which can suppress occurrence of defects.

A resin supply apparatus according to one aspect of the present invention is a resin supply apparatus for supplying a resin onto an object to be coated which is arranged in a lower mold of a resin sealing mold. The resin supply apparatus includes: a calculation unit for calculating a resin supply pattern based on the shape of a cavity of the resin sealing mold; and a supply unit for supplying a resin to the object to be coated along the resin supply pattern. The resin supply pattern has a plurality of linear paths. One of mutually adjacent linear paths in the plurality of linear paths is inclined with respect to an axis of symmetry that divides the cavity in line symmetry, and the other one of the mutually adjacent linear paths in the plurality of linear paths is inclined with respect to the one linear path. A region between the mutually adjacent linear paths in the plurality of linear paths is opened to the outside of the object to be coated, at least on a side on which the other linear path is separated from the one linear path.

According to this aspect, the region between the adjacent linear paths functions as a flow passage for discharging air. In addition, when the resin is spread on the object to be coated, the resin is gradually filled in the region between the mutually adjacent linear paths from a side on which the other linear path approaches one linear path toward a side on which the other linear path is separated from the one linear path. Thus, while the resin is spreading on the object to be coated, a region surrounded by the resin in all directions is not generated, and the region between the adjacent linear paths functions as a flow passage for discharging air. Therefore, air remaining in the region between the adjacent linear paths and gas generated from the resin can be suppressed from being caught in the resin, and occurrence of defects caused by poor filling can be suppressed.

In the above aspect, the plurality of linear paths have a first linear path, a second linear path adjacent to the first linear path, and a third linear path adjacent to the second linear path. The second linear path may be connected to the first linear path at an end portion on a side approaching the first linear path, and may be connected to the third linear path at an end portion on a side approaching the third linear path.

In the above aspect, the resin supply pattern may be one continuous linear line.

In the above aspect, a corner portion of the resin supply pattern may have an R shape.

In the above aspect, the region between the mutually adjacent linear paths in the plurality of linear paths may be opened to the outside of the object to be coated on a side on which the other linear path approaches the one linear path.

In the above aspect, the object to be coated may be a workpiece to be sealed using a supplied resin.

In the above aspect, the object to be coated may be a release film that delivers supplied resin to a workpiece.

In the above aspect, the resin supply apparatus may further include an acquisition unit for acquiring the shape of the cavity of the resin sealing mold and providing the acquired information to the calculation unit.

In the above aspect, the calculation unit may calculate the resin supply pattern in consideration of the shape of a workpiece sealed by the resin supplied to the object to be coated.

In the above aspect, the calculation unit may calculate the resin supply pattern in consideration of arrangement information of elements on the workpiece sealed by the supplied resin.

In the above aspect, the axis of symmetry may extend in a direction in which the elements are aligned.

In the above aspect, the resin supply pattern may be calculated so that the amount of supply of a resin in a region in the workpiece having a small area ratio of the elements is larger than the amount of supply of a resin in a region having a large area ratio of the elements.

In the above aspect, the plurality of linear paths include a set of linear paths adjacent to each other at the center of the workpiece and another set of linear paths adjacent to each other at an end portion of the workpiece, and an angle formed by the set of linear paths may be larger than an angle formed by the other set of linear paths.

In the above aspect, the plurality of linear paths includes a set of linear paths adjacent to each other at the center of the workpiece and another set of linear paths adjacent to each other at an end portion of the workpiece, and an angle formed by the set of linear paths may be smaller than an angle formed by the other set of linear paths.

A resin sealing apparatus according to one aspect of the present invention includes the resin supply apparatus according to any one of the above aspects, and a resin sealing mold for sealing elements on a workpiece with a resin. The resin sealing mold has a cavity in which a resin is filled and a plurality of air vents for discharging air from the cavity. The object to be coated is arranged in the resin sealing mold so that at least one of the plurality of air vents is located on an extension line of a region between mutually adjacent linear paths in the plurality of linear paths.

According to this aspect, when the mold is clamped and the resin is heated and pressurized, the air vents arranged on the extension line of the region between the linear paths are not blocked until the region between the mutually adjacent linear paths is completely filled with a resin. Therefore, in the resin sealing mold, the air remaining in the region between the adjacent linear paths and the gas generated from the resin can be suppressed from being caught in the resin, and the occurrence of defects caused by poor filling can be suppressed.

A method for manufacturing a resin-sealed product according to one aspect of the present invention includes supplying a resin onto an object to be coated which is arranged in a lower mold of a resin sealing mold. The method for manufacturing a resin-sealed product includes: calculating a resin supply pattern based on the shape of a cavity of the resin sealing mold; and supplying a resin to the object to be coated along the resin supply pattern. The resin supply pattern has a plurality of linear paths. One of the mutually adjacent linear paths in the plurality of linear paths is inclined with respect to an axis of symmetry that divides the cavity in line symmetry, and the other one of the mutually adjacent linear paths in the plurality of linear paths is inclined with respect to the one linear path. A region between the mutually adjacent linear paths in the plurality of linear paths is opened to the outside of the object to be coated, at least on a side on which the other linear path is separated from the one linear path According to this aspect, the region between the adjacent linear paths functions as a flow passage for discharging air. In addition, when the resin is spread on the object to be coated, the resin is gradually filled in the region between the mutually adjacent linear paths from a side on which the other linear path approaches one linear path toward a side on which the other linear path is separated from the one linear path. Thus, while the resin is spreading on the object to be coated, a region surrounded by the resin in all directions is not generated, and the region between the adjacent linear paths functions as a flow passage for discharging air. Therefore, the air remaining in the region between the adjacent linear paths and the gas generated from the resin can be suppressed from being caught in the resin, and occurrence of defects caused by poor filling can be suppressed.

In the above aspect, the object to be coated may be a workpiece to be sealed using a supplied resin.

In the above aspect, the object to be coated may be a release film that delivers supplied resin to a workpiece.

Effect

According to the present invention, it is possible to provide a resin supply apparatus, a resin sealing apparatus, and a method for manufacturing a resin-sealed product, which can suppress occurrence of defects.

The embodiments described above are for purposes of facilitating the understanding of the present invention, and should not be interpreted as limiting the present invention. Each element included in the embodiment and its arrangement, material, condition, shape, size, and the like are not limited to the illustrated ones, and can be changed as appropriate. In addition, the configurations shown in different embodiments can be partially replaced or combined.

What is claimed is:

1. A resin sealing apparatus comprising:
a resin supply apparatus for supplying a resin onto an object to be coated which is arranged in a lower mold of a resin sealing mold, the resin supply apparatus comprising:
a processor configured for:
calculating a resin supply pattern based on a shape of a cavity of the resin sealing mold; and
supplying a resin to the object to be coated along the resin supply pattern,
wherein the resin supply pattern has a plurality of linear paths arranged in a first direction,
one of mutually adjacent linear paths in the plurality of linear paths is inclined from the first direction toward a second direction and is inclined with respect to an axis of symmetry that divides the cavity in line symmetry,
wherein the first direction and the second direction are on a same plane, and the second direction is perpendicular to the first direction, the other one of the mutually adjacent linear paths in the plurality of linear paths is inclined from the first direction toward a direction opposite to the second direction and is inclined with respect to the one of the mutually adjacent linear paths, and a region between the mutually adjacent linear paths in the plurality of linear paths is opened to an outside of the object to be coated, at least on a side of the cavity on which the other one of the mutually adjacent linear paths is separated from the one of the mutually adjacent linear paths, wherein the resin supply pattern is formed as a pattern by repeatedly folding back inclined linear paths; and the resin sealing mold for sealing elements on a workpiece with the resin, wherein the resin sealing mold has the cavity in which the resin is filled and a plurality of air vents for discharging air from the cavity, and the object to be coated is arranged in the resin sealing mold so that an extension of at least one of the plurality of air vents arranged radially at a peripheral edge of the resin sealing mold is located within the region between the one of and the other one of mutually adjacent linear paths in the plurality of linear paths.

2. The resin sealing apparatus according to claim 1, wherein the plurality of linear paths has a first linear path, a second linear path adjacent to the first linear path, and a third linear path adjacent to the second linear path, the second linear path is connected to the first linear path at an end portion on a side approaching the first linear path, and is connected to the third linear path at an end portion on a side approaching the third linear path.

3. The resin sealing apparatus according to claim 1, wherein the resin supply pattern is one continuous linear line.

4. The resin sealing apparatus according to claim 1, wherein a corner portion of the resin supply pattern has an R shape.

5. The resin sealing apparatus according to claim 1, wherein a region between the mutually adjacent linear paths in the plurality of linear paths is opened to the outside of the object to be coated on a side on which the other one of the mutually adjacent linear paths approaches the one of the mutually adjacent linear paths.

6. The resin sealing apparatus according to claim 1, wherein the object to be coated is a workpiece to be sealed using a supplied resin.

7. The resin sealing apparatus according to claim 1, wherein the object to be coated is a release film that delivers a supplied resin to a workpiece.

8. The resin sealing apparatus according to claim 1, wherein the processor configured for: acquiring the shape of the cavity of the resin sealing mold and providing an acquired information.

9. The resin sealing apparatus according to claim 1, wherein the processor configured to calculate the resin supply pattern in consideration of the shape of a workpiece sealed by the resin supplied to the object to be coated.

10. The resin sealing apparatus according to claim 9, wherein the plurality of linear paths comprise a set of linear paths adjacent to each other at the center of the workpiece and another set of linear paths adjacent to each other at an end portion of the workpiece, and an angle formed by the set of linear paths is larger than an angle formed by the other set of linear paths.

11. The resin sealing apparatus according to claim 9, wherein the plurality of linear paths comprise a set of linear paths adjacent to each other at the center of the workpiece and another set of linear paths adjacent to each other at an end portion of the workpiece, and an angle formed by the set of linear paths is smaller than an angle formed by the other set of linear paths.

12. The resin sealing apparatus according to claim 1, wherein the processor configured to calculate the resin supply pattern in consideration of arrangement information of elements on a workpiece sealed by the supplied resin.

13. The resin sealing apparatus according to claim 12, wherein the axis of symmetry extends in a direction in which the elements are aligned.

14. The resin sealing apparatus according to claim 12, wherein the resin supply pattern is calculated so that the amount of supply of a resin in a region in the workpiece having a first area ratio of the elements is larger than the amount of supply of a resin in a region having a second area ratio of the elements, and the first area ratio of the elements is smaller than the second area ratio of the elements.

15. The sealing apparatus according to claim 1, wherein the one of mutually adjacent linear paths and the other one of the mutually adjacent linear paths of the plurality of linear paths form a pair of mutually adjacent linear paths, and the plurality of linear paths comprises other pairs of the mutually adjacent linear paths, and wherein an angle formed between each pair of the mutually adjacent linear paths is an acute angle of less than and not equal to 45°, and the angle formed by of the pair of the mutually adjacent linear paths at a center of the resin sealing mold in the second direction is different from the angle formed by the pair of the mutually adjacent linear paths at the peripheral edge of the resin sealing mold in the second direction.

* * * * *